United States Patent
Lee et al.

(10) Patent No.: US 11,444,127 B2
(45) Date of Patent: Sep. 13, 2022

(54) MEMORY DEVICES

(71) Applicant: SAMSUNG ELECTRONICS CO., LTD., Suwon-si (KR)

(72) Inventors: Jinwoo Lee, Seoul (KR); Kwangmin Park, Seoul (KR); Zhe Wu, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 87 days.

(21) Appl. No.: 17/019,649

(22) Filed: Sep. 14, 2020

(65) Prior Publication Data
US 2021/0313397 A1   Oct. 7, 2021

(30) Foreign Application Priority Data
Apr. 7, 2020   (KR) .................. 10-2020-0042406

(51) Int. Cl.
*H01L 27/24* (2006.01)
*H01L 45/00* (2006.01)

(52) U.S. Cl.
CPC ........ *H01L 27/249* (2013.01); *H01L 45/1233* (2013.01); *H01L 45/1253* (2013.01); *H01L 45/16* (2013.01)

(58) Field of Classification Search
None
See application file for complete search history.

(56) References Cited

U.S. PATENT DOCUMENTS

| | | | |
|---|---|---|---|
| 8,634,236 B2 | 1/2014 | Park et al. | |
| 8,767,447 B2 | 7/2014 | Lam et al. | |
| 9,006,076 B2 | 4/2015 | Oh | |
| 9,780,144 B2 | 10/2017 | Seong et al. | |
| 10,109,679 B2 | 10/2018 | Chen et al. | |
| 10,163,978 B2 | 12/2018 | Sciarrillo et al. | |
| 10,249,819 B2 | 4/2019 | Campbell et al. | |
| 10,256,406 B2 | 4/2019 | Collins et al. | |
| 10,381,072 B2 | 8/2019 | Hu et al. | |
| 2007/0158698 A1 | 7/2007 | Dennison et al. | |
| 2008/0248632 A1* | 10/2008 | Youn .................. H01L 45/1683 438/483 |
| 2011/0057161 A1 | 3/2011 | Sandhu et al. | |
| 2019/0140171 A1 | 5/2019 | Brightsky et al. | |
| 2019/0157556 A1 | 5/2019 | Brightsky | |
| 2020/0365799 A1* | 11/2020 | Lee ..................... H01L 45/1233 |

\* cited by examiner

*Primary Examiner* — Mounir S Amer
(74) *Attorney, Agent, or Firm* — Lee IP Law, P.C.

(57) ABSTRACT

A memory device including a first conductive line on a substrate and extending in a first horizontal direction; a second conductive line on the first conductive line and extending in a second horizontal direction that is perpendicular to the first horizontal direction; and a memory cell between the first conductive line and the second conductive line, the memory cell including a variable resistance memory layer, a buffer resistance layer, and a switch material pattern, extending in a vertical direction that is perpendicular to the first horizontal direction and the second horizontal direction, and having a tapered shape with a decreasing horizontal width along the vertical direction, wherein at least a part of the variable resistance memory layer and at least a part of the buffer resistance layer of the memory cell are at a same vertical level.

18 Claims, 46 Drawing Sheets

MEMORY DEVICES

CROSS-REFERENCE TO RELATED APPLICATION

Korean Patent Application No. 10-2020-0042406, filed on Apr. 7, 2020, in the Korean Intellectual Property Office, and entitled: "Memory Devices," is incorporated by reference herein in its entirety.

BACKGROUND

1. Field

Embodiments relate to a memory device.

2. Description of the Related Art

As the demand for high integration of a memory device increases according to a tendency for weight reduction and simplification of electronic products, a memory device having a cross-point structure may include memory cells arranged at a point where two electrodes cross. Materials forming a variable resistance memory layer of the memory device having the cross-point structure may have resistance values changing according to an applied voltage, and digital information may be stored and deleted in and from the memory cell according to a resistance change in the variable resistance memory layer.

SUMMARY

The embodiments may be realized by providing a memory device including a first conductive line on a substrate and extending in a first horizontal direction; a second conductive line on the first conductive line and extending in a second horizontal direction that is perpendicular to the first horizontal direction; and a memory cell between the first conductive line and the second conductive line, the memory cell including a variable resistance memory layer, a buffer resistance layer, and a switch material pattern, extending in a vertical direction that is perpendicular to the first horizontal direction and the second horizontal direction, and having a tapered shape with a decreasing horizontal width along the vertical direction, wherein at least a part of the variable resistance memory layer and at least a part of the buffer resistance layer of the memory cell are at a same vertical level.

The embodiments may be realized by providing a memory device including a plurality of first conductive lines on a substrate and extending in a first horizontal direction; a plurality of second conductive lines on the plurality of first conductive lines and extending in a second horizontal direction that is perpendicular to the first horizontal direction; and a plurality of memory cells respectively between the plurality of first conductive lines and the plurality of second conductive lines, each memory cell of the plurality of memory cells including: a lower electrode, an intermediate electrode, an upper electrode, a variable resistance memory layer and a buffer resistance layer, which are connected between the intermediate electrode and the upper electrode in parallel, and a switch material pattern between the lower electrode and the intermediate electrode, wherein the variable resistance memory layer includes a recess that is concave.

The embodiments may be realized by providing a memory device including a plurality of first conductive lines on a substrate and extending in a first horizontal direction; a plurality of second conductive lines on the plurality of first conductive lines and extending in a second horizontal direction that is perpendicular to the first horizontal direction; and a plurality of memory cells respectively between the plurality of first conductive lines and the plurality of second conductive lines, each memory cell of the plurality of memory cells including: a lower electrode, an intermediate electrode, an upper electrode, a variable resistance memory layer and a buffer resistance layer, which are connected between the intermediate electrode and the upper electrode in parallel, and a switch material pattern between the lower electrode and the intermediate electrode, wherein the variable resistance memory layer has a circular horizontal cross-section, and the buffer resistance layer has a ring-shaped horizontal cross-section surrounding a periphery of the variable resistance memory layer, the buffer resistance layer including a material having a resistivity that is less than a resistivity of the variable resistance memory layer in a high-resistance state and greater than a resistivity of the variable resistance memory layer in a low-resistance state.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
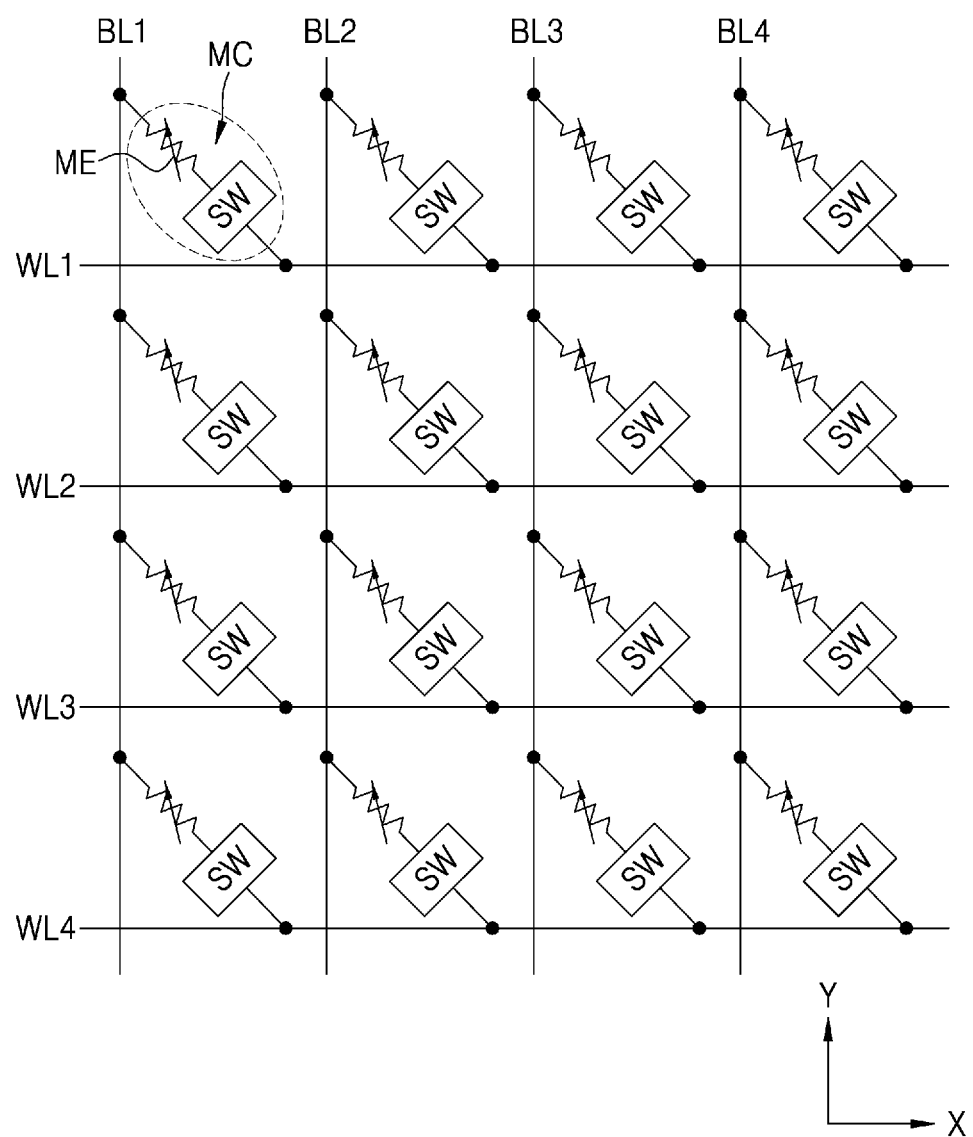
FIG. 1 is an equivalent circuit diagram of a memory device according to example embodiments.

FIG. 1 is an equivalent circuit diagram of a memory device according to example embodiments.

Referring to FIG. 1, a memory device 10 may include word lines WL1, WL2, WL3, and WL4 extending in a first horizontal direction (e.g., an X direction of FIG. 1) and bit lines BL1, BL2, BL3, and BL4 extending in a second horizontal direction (e.g., a Y direction of FIG. 1) perpendicular to the first horizontal direction (the X direction). The word lines WL1, WL2, WL3, and WL4 and the bit lines BL1, BL2, BL3, and BL4 may be at different vertical levels (e.g., relative to a vertical Z direction discussed below). Memory cells MC may be respectively connected to the word lines WL1, WL2, WL3, and WL4 and the bit lines BL1, BL2, BL3, and BL4. Each of the memory cells MC may include a variable resistance material layer ME for storing information and a switching device SW for selecting a memory cell. The switching device SW may be referred to as a selection device or an access device.

The word lines WL1, WL2, WL3, and WL4 and the bit lines BL1, BL2, BL3, and BL4 may be at different vertical levels. The variable resistance material layer ME and the switching device SW may be at different vertical levels in vertical directions perpendicular to the first horizontal direction (the X direction) and the second horizontal direction (the Y direction), respectively.

In an implementation, voltages may be applied to the variable resistance material layers ME of the memory cells MC through the word lines WL1, WL2, WL3, and WL4 and the bit lines BL1, BL2, BL3, and BL4, and thus, currents may flow in the variable resistance material layers ME. In an implementation, the variable resistance material layer ME may include a phase change material layer that may be reversibly transited between a first state and a second state. In an implementation, the variable resistance material layer ME may include a suitable variable resistor having a resistance value changing according to an applied voltage. In an implementation, a resistance of the variable resistance material layer ME may be reversibly transited or switched between the first state and the second state, according to the voltage applied to the variable resistance material layer ME of the selected memory cell MC.

According to a resistance change of the variable resistance material layer ME, digital information such as "0" or "1" may be stored in the memory cell MC and may be deleted therefrom. In an implementation, the data may be written in the memory cell MC as a high-resistance state "0" and a low-resistance state "1". In an implementation, the memory cell MC may store various resistance states.

An arbitrary memory cell MC may be addressed by a selection of the word lines WL1, WL2, WL3, and WL4 and the bit lines BL1, BL2, BL3, and BL4, the memory cell MC may be programmed by applying certain signals between the word lines WL1, WL2, WL3, and WL4 and the bit lines BL1, BL2, BL3, and BL4, and information according to the resistance value of the variable resistor forming a corresponding memory cell MC may be read by measuring a current value through the bit lines BL1, BL2, BL3, and BL4.

Figure 2A:
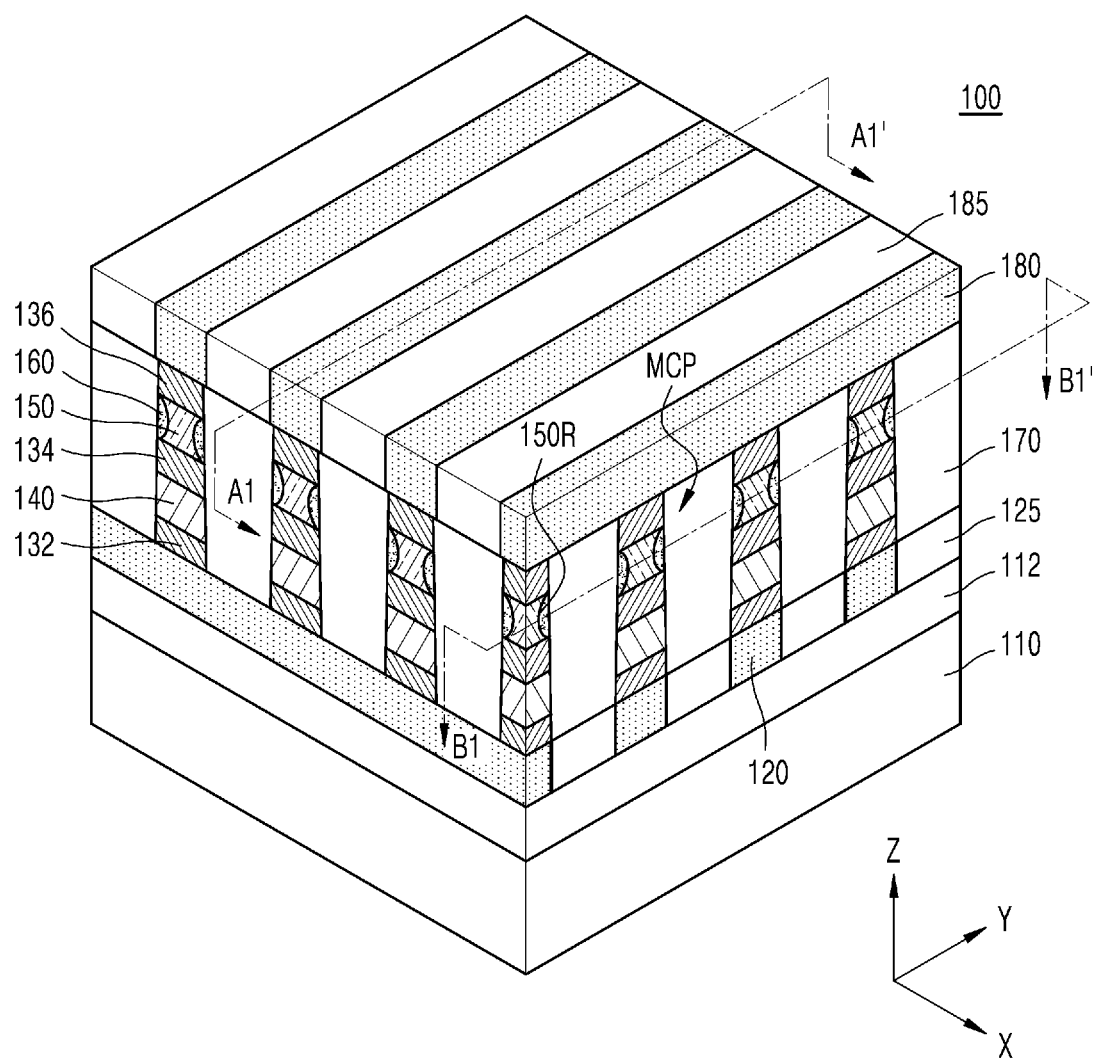
FIG. 2A is a perspective view of a memory device according to example embodiments.
Figure 2B:
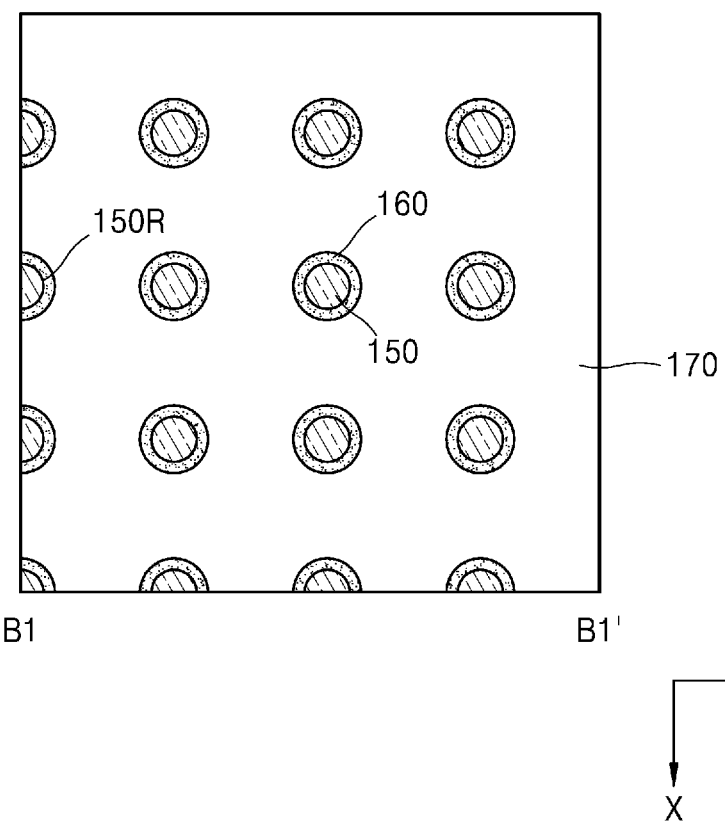
FIG. 2B is a cross-sectional view of the memory device taken along a line B1-B1' of FIG. 2A.

FIG. 2A is a perspective view of a memory cell according to example embodiments, and FIG. 2B is a cross-sectional view of the memory cell taken along a line B1-B1' of FIG. 2A.

Referring to FIGS. 2A and 2B, a memory device 100 may include first conductive lines 120, second conductive lines 180, and memory cells MCP on a substrate 110.

An interlayer insulating layer 112 may be on the substrate 110. The interlayer insulating layer 112 may include oxide such as silicon oxide or nitride such as silicon nitride. Transistors forming driving circuits for driving the memory cells MCP may be formed on the substrate 110. In an implementation, the driving circuits may be peripheral circuits for processing data that is input/output to/from the memory cells MCP, and examples of the peripheral circuit may include a page buffer, a latch circuit, a cache circuit, a column decoder, a sense amplifier, a data in/out circuit, a row decoder, or the like. In an implementation, the driving circuit may be in regions of the substrate 110 that vertically overlap the memory cells MCP, and the interlayer insulating layer 112 may cover the driving circuit on the substrate 110. In an implementation, the driving circuit may be in regions of the substrate 110 that do not vertically overlap the memory cells MCP.

The first conductive lines 120 may extend (e.g., lengthwise) in the first horizontal direction (the X direction) on the interlayer insulating layer 112. The second conductive lines 180 may extend (e.g., lengthwise) in the second horizontal direction (the Y direction) at a higher vertical level than the first conductive lines 120 with respect to an upper surface of the substrate 110. For example, the second conductive lines 180 may be farther from the substrate 110 in the vertical Z direction than the first conductive lines 120 are to the substrate in the Z direction. The first conductive lines 120 may correspond to the word lines WL1, WL2, WL3, and WL4 of FIG. 1, and the second conductive lines 180 may correspond to the bit lines BL1, BL2, BL3, and BL4 of FIG. 1.

The first and second conductive lines 120 and 180 may each include metal, conductive metal nitride, conductive metal oxide, or a combination thereof. In an implementation, the first and second conductive lines 120 and 180 may each include, e.g., W, WN, Au, Ag, Cu, Al, TiAlN, Ir, Pt, Pd, Ru, Zr, Rh, Ni, Co, Cr, Sn, Zn, ITO, an alloy thereof, or a combination thereof. In an implementation, the first and second conductive lines 120 and 180 may each include a metal layer and a conductive barrier layer covering at least part of the metal layer. The conductive barrier layer may include, e.g., TI, TiN, Ta, TaN, or a combination thereof. As used herein, the term "or" is not an exclusive term, e.g., "A or B" would include A, B, or A and B.

First insulating layers 125 may be respectively between the first conductive lines 120, and second insulating layers 185 may be respectively between the second conductive lines 180. The first insulating layers 125 may have line shapes extending in the first horizontal direction (the X direction), and the second insulating layers 185 may have line shapes extending in the second horizontal direction (the Y direction).

The memory cells MCP may be respectively between the first conductive lines 120 and the second conductive lines 180. The memory cells MCP may be in areas where the first conductive lines 120 and the second conductive lines 180 overlap in the vertical direction (Z direction), and the memory cells MCP may be respectively connected to corresponding first and second conductive lines 120 and 180.

Each memory cell MCP may include, e.g., a lower electrode 132, a switch material pattern 140, an intermediate electrode 134, a variable resistance memory layer 150, and an upper electrode 136, which are sequentially stacked on the first conductive line 120.

In an implementation, the lower electrode 132, the intermediate electrode 134, and the upper electrode 136 may each include, e.g., TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or a combination thereof. In an implementation, the upper electrode 136 may include a conductive layer capable of generating heat sufficient enough to cause a phase change of the variable resistance memory layer 150.

In an implementation, as illustrated in FIG. 2A the switch material pattern 140 may be between the lower electrode 132 and the intermediate electrode 134 and the variable resistance memory layer 150 may be between the intermediate electrode 134 and the upper electrode 136 in each memory cell MCP. In an implementation, in each memory cell MCP, the variable resistance memory layer 150 may be between the lower electrode 132 and the intermediate electrode 134, and the switch material pattern 140 may be between the intermediate electrode 134 and the upper electrode 136. In an implementation, the lower electrode 132 may include a conductive material to generate heat that is sufficient enough to cause a phase change in the variable resistance memory layer 150.

In an implementation, as illustrated in FIG. 2A one upper electrode 136 may be connected to one variable resistance memory layer 150. In an implementation, one upper electrode 136 may be shared by two variable resistance memory layers 150.

In an implementation, a first interface layer and a second interface layer may be between the lower electrode 132 and the switch material pattern 140 and between the switch material pattern 140 and the intermediate electrode 134. The first interface layer and the second interface layer may be material layers to prevent damage to the switch material pattern 140 according to contact between the lower electrode 132 and the switch material pattern 140 and contact between the switch material pattern 140 and the intermediate electrode 134, respectively. The first interface layer and the second interface layer may each include a conductive material, e.g., carbon.

Each memory cell MCP may further include a buffer resistance layer 160 at substantially the same vertical level as the variable resistance memory layer 150 (e.g., at least a part of the buffer resistance layer 160 may be about the same distance from the substrate 110 as at least a part of the variable resistance memory layer 150 is from the substrate, as measured in the Z direction). For example, the buffer resistance layer 160 may be laterally adjacent (in one of the X direction or the Y direction) to the variable resistance memory layer 150. The buffer resistance layer 160 may be between the intermediate electrode 134 and the upper electrode 136. The variable resistance memory layer 150 and the buffer resistance layer 160 may be connected to the intermediate electrode 134 and the upper electrode 136 in parallel. In an implementation, the variable resistance memory layer 150 and the buffer resistance layer 160 may function as resistors between the intermediate electrode 134 and the upper electrode 136, the resistors being connected in parallel.

In an implementation, the buffer resistance layer 160 may include, e.g., titanium silicon nitride, zirconium oxide, titanium oxynitride, or the like. Materials of the buffer resistance layer 160 may vary according to shapes and materials of the variable resistance memory layer 150 and shapes of the buffer resistance layer 160. In an implementation, the buffer resistance layer 160 may include a material having a smaller resistivity than a reset resistance Rreset that is a resistivity in a reset state (a high-resistance state) of the variable resistance memory layer 150. In an implementation, the resistivity of the buffer resistance layer 160 may have a smaller value in an order of magnitude that is equal to an initial value of the reset resistance Rreset of the variable resistance memory layer 150. In an implementation, the reset resistance Rreset of the variable resistance memory layer 150 may have ten times less than or equal to the resistivity of the buffer resistance layer 160. The resistivity of the buffer resistance layer 160 may have a greater value than a set resistance Rset that is a resistivity in a set state (a low-resistance state) of the variable resistance memory layer 150.

Each memory cell MCP, which includes the lower electrode 132, the switch material pattern 140, the intermediate electrode 134, the variable resistance memory layer 150, the buffer resistance layer 160, and the upper electrode 136, may have a circular or rounded horizontal cross-section (e.g., a section taken along a plane defined by the X direction and the Y direction and as viewed along the Z direction), and a shape of each memory cell MCP may be almost a cylinder. Each memory cell MCP including the lower electrode 132, the switch material pattern 140, the intermediate electrode 134, the variable resistance memory layer 150, the buffer resistance layer 160, and the upper electrode 136 may have a tapered shape (see, e.g., FIG. 10F) extending (e.g., along the Z direction) from a lower portion (proximate to the substrate 110 in the Z direction) to an upper portion (e.g., portion distal to the substrate 110 in the Z direction), e.g., having a decreasing horizontal width and a decreasing horizontal cross-section (as measured in the X direction or Y direction).

The buffer resistance layer 160 may surround side walls of the variable resistance memory layer 150. In an implementation, an upper surface (e.g., surface facing away from the substrate 110 in the Z direction) and a lower surface (e.g., surface that faces the substrate 110 in the Z direction) of the variable resistance memory layer 150 may contact the upper electrode 136 and the intermediate electrode 134, respectively, and the side walls of the variable resistance memory layer 150 may contact the buffer resistance layer 160. In an implementation, the buffer resistance layer 160 may have an upper surface located at the same vertical level as (e.g., coplanar with) the upper surface of the variable resistance memory layer 150, and a lower surface at the same vertical level as the lower surface of the variable resistance memory layer 150.

The variable resistance memory layer 150 may have a horizontal cross-section having a circular shape, and the buffer resistance layer 160 may have a ring-shaped horizontal cross-section surrounding a periphery of the variable resistance memory layer 150. The variable resistance memory layer 150 may have concave recess portions or recesses 150R in or at the side walls thereof. In an implementation, the variable resistance memory layer 150 may have the recesses 150R having central portions of side surfaces that are more concave than upper and lower portions on a vertical cross-section. The recesses 150R may surround the variable resistance memory layer 150 along the side walls thereof. The buffer resistance layer 160 may have an inner side wall having a convex shape to fill the recesses 150R of the variable resistance memory layer 150. The buffer resistance layer 160 may extend from a lower portion to an upper portion in a straight line and may have an outer side wall having a decreasing a horizontal width.

On the first conductive lines 120, buried insulating layers 170 may be between the memory cells MCP. The buried insulating layer 170 may surround side walls of the lower electrode 132, the switch material pattern 140, the intermediate electrode 134, the buffer resistance layer 160, and the upper electrode 136 that form each memory cell MCP. Side walls of the lower electrode 132, the switch material pattern 140, and the intermediate electrode 134, an outer side wall of the buffer resistance layer 160, and a side wall of the upper electrode 136, which form each memory cell MCP, may be arranged in a straight line. The variable resistance memory layer 150 may be separated from the buried insulating layer 170 with or by the buffer resistance layer 160 therebetween. The buried insulating layer 170 may include, e.g., silicon nitride, silicon oxide, silicon oxynitride, or a combination thereof. In an implementation, the buried insulating layer 170 may include silicon nitride. In an implementation, the buried insulating layer 170 may have an upper surface at the same vertical level as the upper surface of the upper electrode 136.

The switch material pattern 140 may be a current control layer that controls a current flow. The switch material pattern 140 may include a material layer of which a resistance changes according to voltages applied to both ends of the switch material pattern 140. In an implementation, the switch material pattern 140 may include a material layer having an ovonic threshold switching (OTS) characteristic. The switch material pattern 140 may include a chalcogenide material as an OTS material. In an implementation, the switch material pattern 140 may include silicon (Si), tellurium (Te), selenium (Se), sulfur (S), arsenic (As), germanium (Ge), indium (In), antimony (Sb), or a combination thereof. In an implementation, the switch material pattern 140 may include a chalcogenide material having a chemical formula, $Ge_xAs_ySe_zSi_U$ ($0<X+Y+Z+U\leq1$).

The variable resistance memory layer 150 may include a phase change material that reversely changes between an amorphous state and a crystalline state, according to a heating time. In an implementation, a phase of the variable resistance memory layer 150 may reversely change according to Joule heating generated because of the voltage applied to both ends of the variable resistance memory layer 150, and due to such a phase change, the variable resistance memory layer 150 may include a material used to change a resistance. In an implementation, a state of the phase change material may be a high-resistance state in an amorphous phase and a low-resistance state in a crystalline phase. When the high-resistance state is defined as "0" and the low-resistance state is defined as "1," the variable resistance memory layer 150 may store therein data.

In an implementation, the variable resistance memory layer 150 may include Ge—Sb—Te, Ge—Te, Sb—Te, In—Se, Ga—Sb, In—Sb, As—Te, Al—Te, Bi—Sb—Te(BST), In—Sb—Te(IST), Ge—Sb—Te, Te—Ge—As, Te—Sn—Se, Ge—Se—Ga, Bi—Se—Sb, Ga—Se—Te, Sn—Sb—Te, In—Sb—Ge, In—Ge—Te, Ge—Sn—Te, Ge—Bi—Te, Ge—Te—Se, As—Sb—Te, Sn—Sb—Bi, Ge—Te—O, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, In—Sn—Sb—Te, and As—Ge—Sb—Te, or a combination thereof.

In an implementation, the variable resistance memory layer 150 may further include impurities, e.g., C, N, Si, O, B, or Sn. In an implementation, the variable resistance memory layer 150 may further include a metal, e.g., Al, Ga, Zn, Ti, Cr, Mn, Fe, Co, Ni, Mo, Ru, Pd, Hf, Ta, Ir, Pt, Zr, Tl, Pb, or Po.

In an implementation, the variable resistance memory layer 150 may have a multilayered structure in which at least two layers having different physical properties are stacked, and a barrier layer may be further formed between the at least two layers, the barrier layer preventing the diffusion of materials between the layers. In an implementation, the variable resistance memory layer 150 may have a superlattice structure in which layers including different materials are alternately stacked. In an implementation, the variable resistance memory layer 150 may have a structure in which a first layer including Ge—Te and a second layer including Sb—Te are alternately stacked. In an implementation, the first and second layers may include the materials listed above, respectively.

In an implementation, the variable resistance memory layer 150 of the memory device 100 may include various materials having resistance change characteristics.

In an implementation, when the variable resistance memory layer 150 includes transition metal oxide, the memory device 100 may be Resistive Random Access Memory (ReRAM). At least one electrical path may be formed in or removed from the variable resistance memory layer 150 including the transition metal oxide, according to the program operation. When the above electrical path is formed, the variable resistance memory layer 150 may have a low-resistance value, and when the electrical path is removed, the variable resistance memory layer 150 may have a high-resistance value. The memory device 100 may store data by using a difference between the resistance values of the variable resistance memory layer 150.

When the variable resistance memory layer 150 includes transition metal oxide, the transition metal oxide may include Ta, Zr, Ti, Hf, Mn, Y, Ni, CO, Zn, Nb, Cu, Fe, or Cr. In an implementation, the transition metal oxide may be a layer or layers including $Ta_2O_{5-x}$, $ZrO_{2-x}$, $TiO_{2-x}$, $HfO_{2-x}$, $MnO_{2-x}$, $Y2O_{3-x}$, $NiO_{1-y}$, $Nb2O_{5-x}$, $CuO_{1-y}$, or $Fe_2O_{3-x}$. In the above materials, x and y may be selected in ranges of $0\leq x\leq1.5$ and $0\leq y\leq0.5$, respectively.

In an implementation, when the variable resistance memory layer 150 has a Magnetic Tunnel Junction (MTJ) structure that includes two electrodes including magnetic substances and a dielectric between the electrodes, the memory device 100 may be Magnetic RAM (MRAM).

Two electrodes may be a magnetization fix layer and a magnetization free layer, respectively, and the dielectric between the electrodes may be a tunnel barrier layer. The magnetization fix layer may have a magnetization direction fixed in one direction, and the magnetization free layer may have a changeable magnetization direction to be parallel or semi-parallel to the magnetization direction of the magnetization fix layer. The magnetization directions of the magnetization fix layer and the magnetization free layer may be parallel to one surface of the tunnel barrier layer. The magnetization directions of the magnetization fix layer and the magnetization free layer may be perpendicular to one surface of the tunnel barrier layer. When the magnetization direction of the magnetization free layer is parallel to that of the magnetization fix layer, the variable resistance memory layer 150 may have a first resistance value. When the magnetization direction of the magnetization free layer is semi-parallel to that of the magnetization fix layer, the variable resistance memory layer 150 may have a second resistance value. By using a difference between the resistance values, the memory device 100 may store data. The magnetization direction of the magnetization free layer may be changed according to a spin torque of electrons in a program current.

The magnetization fix layer and the magnetization free layer may each include a magnetic material. In an implementation, the magnetization fix layer may further include an antiferromagnetic material used to fix a magnetization direction of a ferromagnetic material in the magnetization fix layer. The tunnel barrier may include an oxide of Mg, Ti, Al, MgZn, or MgB.

The second conductive lines 180 may be on the upper electrode 136 and the buried insulating layer 170.

As a period of time in which the memory device is used passes, the reset resistance Rreset of the variable resistance memory layer may increase, and the set resistance Rset may remain constant. In the memory device 100 according to an embodiment, the variable resistance memory layer 150 and the buffer resistance layer 160 may be connected in parallel, and data may be written in the memory cells MCP as the high-resistance state "0" and the low-resistance state "1" because of resistance values of the resistivity of the variable resistance memory layer 150 and the resistivity of the buffer resistance layer 160 that are connected in parallel.

An increase rate of the reset resistance Rreset of the memory cell MCP, in which the variable resistance memory layer 150 and the resistivity of the buffer resistance layer 160 connected in parallel, may decrease compared to an increase rate of a reset resistance Rreset of the variable resistance memory layer 150, as a use time of the memory device 100 passes. Therefore, because an increase in a voltage used to transmit the state of the memory cell MCP from the high-resistance state to the low-resistance state is relatively small, the endurance of the memory cell MCP may be improved and an increase in the power consumption may be reduced.

Figure 3A:
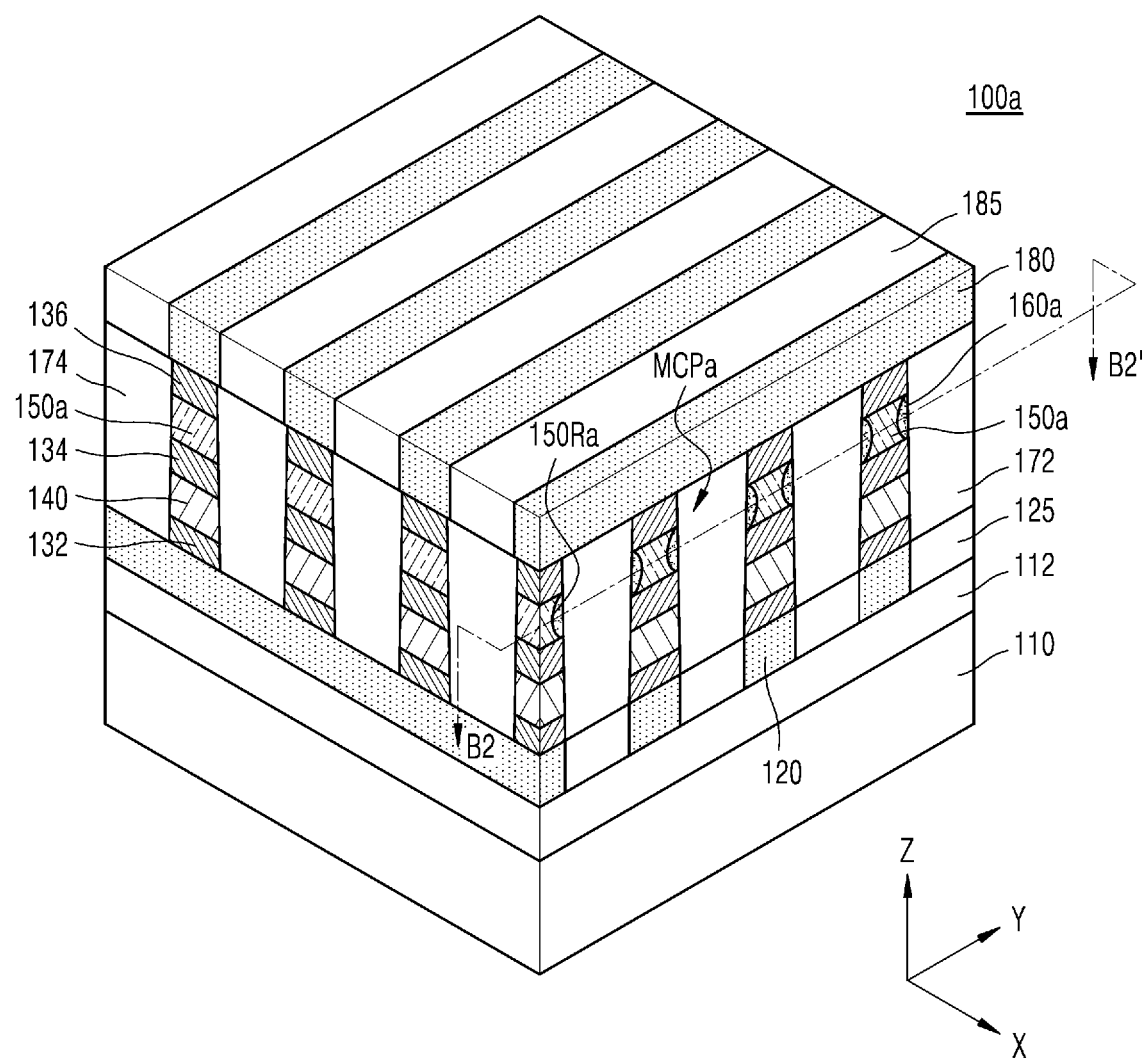
FIG. 3A is a perspective view of a memory device according to example embodiments.
Figure 3B:
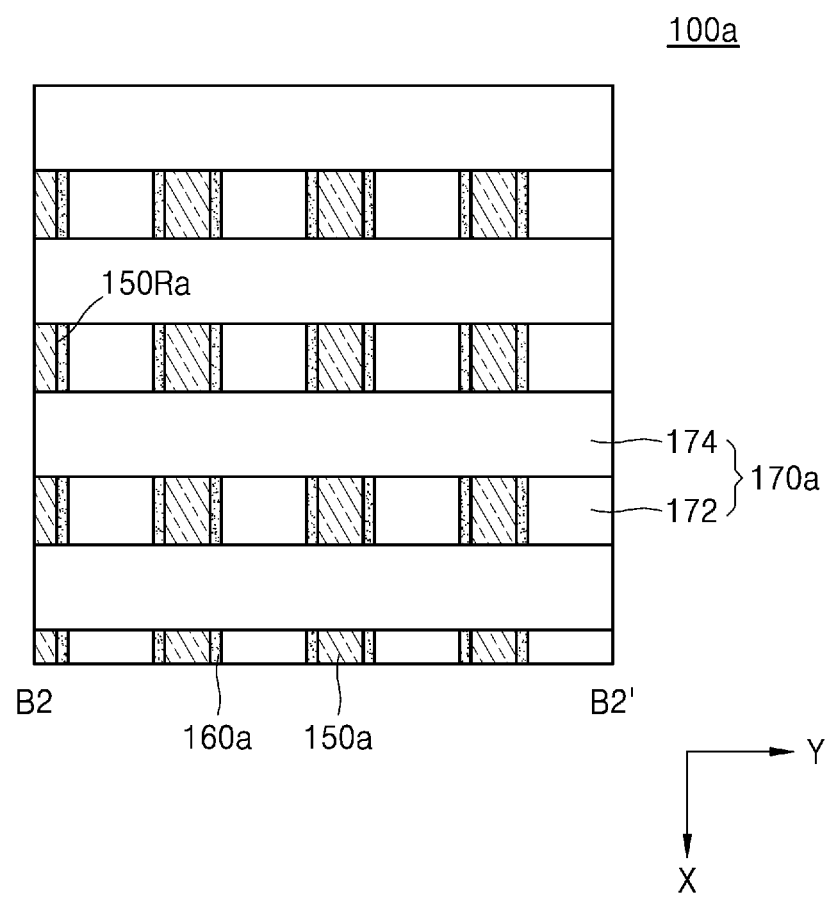
FIG. 3B is a cross-sectional view of the memory device taken along a line B2-B2' of FIG. 3A.

FIG. 3A is a perspective view of a memory device according to example embodiments, and FIG. 3B is a cross-sectional view of the memory device taken along a line B2-B2' of FIG. 3A. The same reference symbols as those in FIGS. 2A and 2B denote substantially the same elements in FIGS. 3A and 3B, and the descriptions provided with reference to FIGS. 2A and 2B may be omitted.

Referring to FIGS. 3A and 3B, a memory device 100a may include the first conductive lines 120, the second conductive lines 180, and memory cells MCPa on the substrate 110. Each memory cell MCPa may include the lower electrode 132, the switch material pattern 140, the intermediate electrode 134, a variable resistance memory layer 150a, and the upper electrode 136, which are sequentially on the first conductive line 120. Each memory cell MCPa may further include a buffer resistance layer 160a between the intermediate electrode 134 and the upper electrode 136.

Each memory cell MCPa, which includes the lower electrode 132, the switch material pattern 140, the intermediate electrode 134, the variable resistance memory layer 150a, the buffer resistance layer 160a, and the upper electrode 136, may have a square or rectangular horizontal cross-section, and a shape of each memory cell MCPa may be almost a square or rectangular pillar. Each memory cell MCPa, which includes the lower electrode 132, the switch material pattern 140, the intermediate electrode 134, the variable resistance memory layer 150a, the buffer resistance layer 160a, and the upper electrode 136, may have a tapered shape extending from a lower portion to an upper portion and having a decreasing horizontal width and a horizontal cross-section.

In one memory cell MCPa, two buffer resistance layers 160a may cover both (e.g., opposite) side walls of the variable resistance memory layer 150a. The variable resistance memory layer 150a may have a rectangular horizontal cross-section, and two buffer resistance layers 160a may extend along lateral sides of the variable resistance memory layer 150a. Thus, the buffer resistance layers 160a may each have a horizontal cross-section having a bar shape. The variable resistance memory layer 150a may have recesses 150Ra in or at side walls that the buffer resistance layers 160a contact. In an implementation, the variable resistance memory layer 150a may have the recesses 150Ra such that a central portion of a side surface may be more concave than upper and lower portions on a vertical cross-section. The recess 150Ra may extend on or along the side walls of the variable resistance memory layer 150a in the first horizontal direction (the X direction). The buffer resistance layer 160a may have a convex inner side wall to fill the recesses 150Ra of the variable resistance memory layer 150a.

On the first conductive lines 120, a buried insulating layer 170a may be between the memory cells MCPa. The buried insulating layer 170a may surround side walls of the lower electrode 132, the switch material pattern 140, the intermediate electrode 134, the variable resistance memory layer 150a, the buffer resistance layer 160a, and the upper electrode 136 that form each memory cell MCPa.

The buried insulating layer 170a may include a first buried insulating layer 172 and a second buried insulating layer 174. The first buried insulating layer 172 may be between two adjacent memory cells MCPa from among the memory cells MCPa in the second horizontal direction (the Y direction). The first buried insulating layer 172 may contact the buffer resistance layer 160a and may not contact the variable resistance memory layer 150a. The second buried insulating layer 174 may be between columns of the memory cells MCPa arranged in the second horizontal direction (the Y direction) and may extend (e.g., lengthwise) in the second horizontal direction (the Y direction). The second buried insulating layer 174 may respectively contact the variable resistance memory layer 150a and the buffer resistance layer 160a. In an implementation, the first buried insulating layer 172 and the second buried insulating layer 174 may each include silicon nitride.

In an implementation, the recesses 150Ra may extend from the side walls of the variable resistance memory layer 150a in the second horizontal direction (the Y direction). In an implementation, the first buried insulating layer 172 may be between two adjacent memory cells MCPa from among the memory cells MCPa in the first horizontal direction (the X direction). In an implementation, the second buried insulating layer 174 may be between columns of the memory cells MCPa in the first horizontal direction (the X direction) and may extend in the first horizontal direction (the X direction).

Figure 4A:
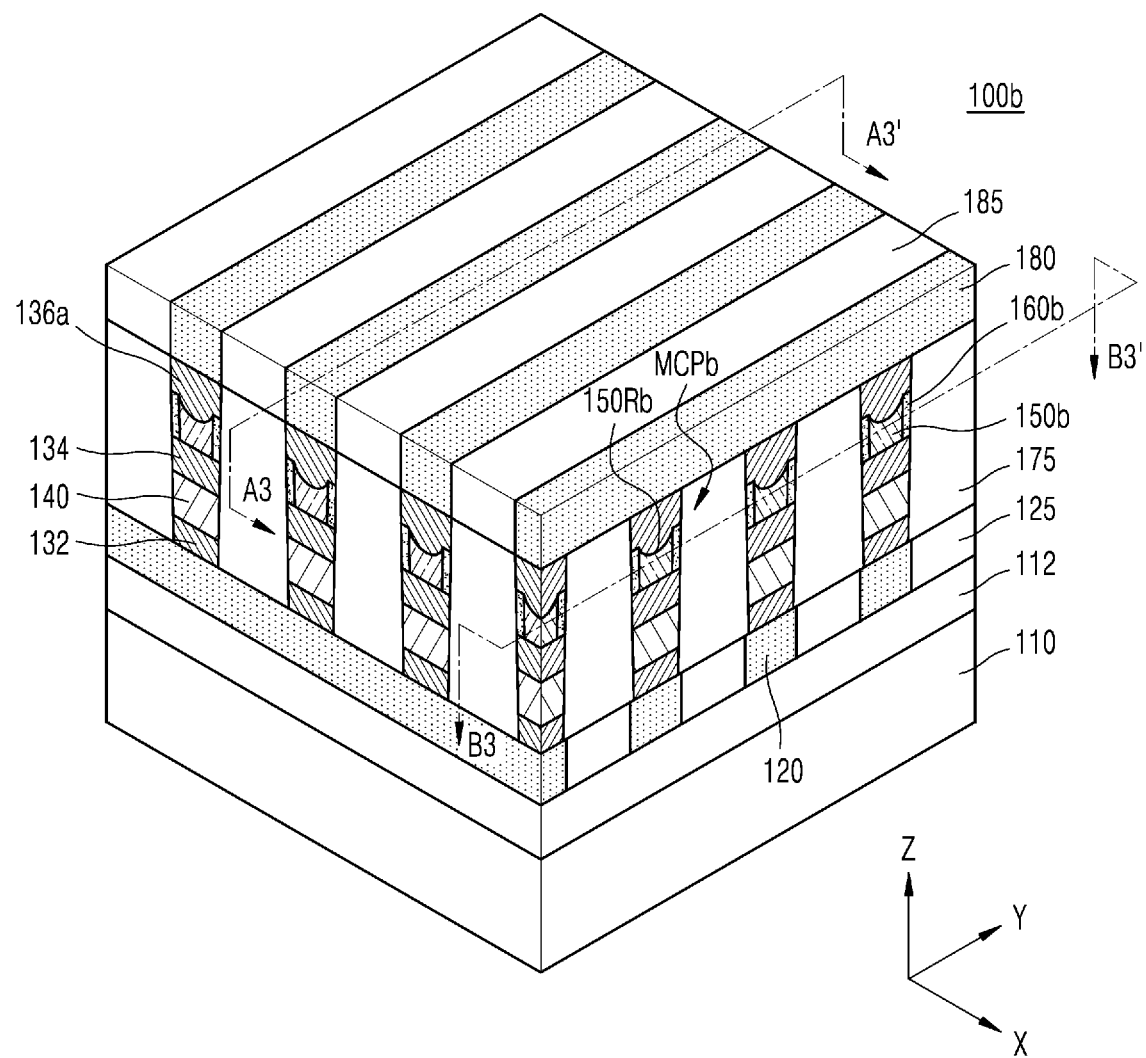
FIG. 4A is a perspective view of a memory device according to example embodiments.
Figure 4B:
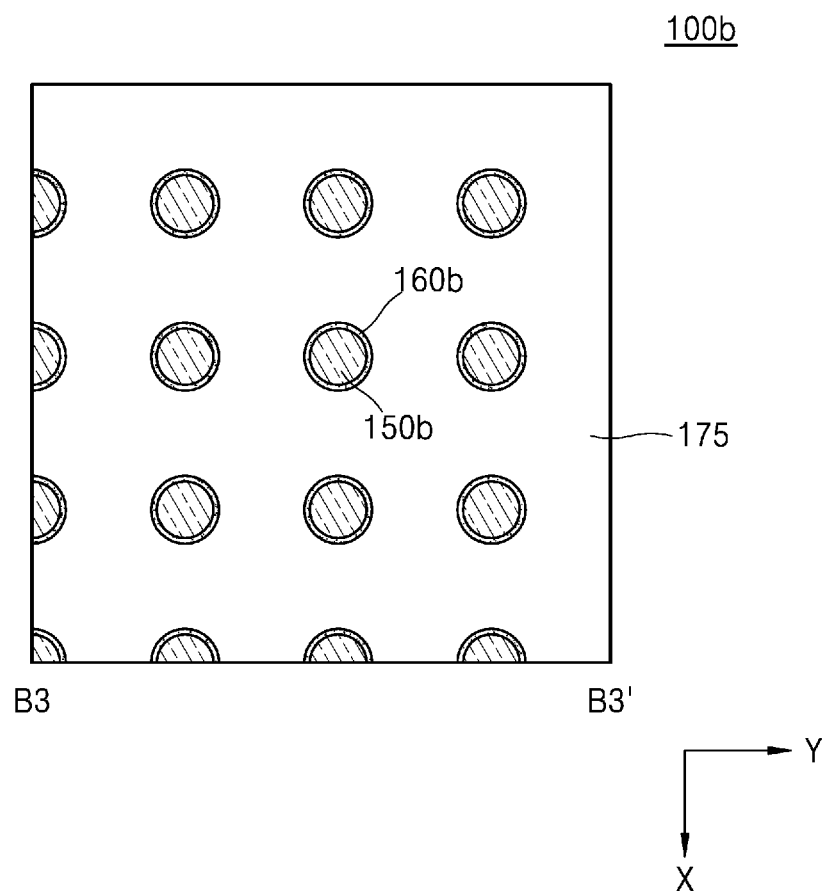
FIG. 4B is a cross-sectional view of the memory device taken along a line B3-B3' of FIG. 4A.

FIG. 4A is a perspective view of a memory device according to example embodiments, and FIG. 4B is a cross-sectional view of the memory device taken along a line B3-B3' of FIG. 4A. The same reference symbols as those in FIGS. 2A and 2B denote substantially the same elements in FIGS. 4A and 4B, and the descriptions provided with reference to FIGS. 2A and 2B may be omitted.

Referring to FIGS. 4A and 4B, a memory device 100b may include the first conductive lines 120, the second conductive lines 180, and memory cells MCPb that are on the substrate 110. Each memory cell MCPb may include the lower electrode 132, the switch material pattern 140, the intermediate electrode 134, a variable resistance memory layer 150b, and an upper electrode 136a that are sequentially on the first conductive line 120. Each memory cell MCPb may further include a buffer resistance layer 160b between the intermediate electrode 134 and the upper electrode 136a. The buffer resistance layer 160b may surround side walls of the variable resistance memory layer 150b.

Each memory cell MCPb, which includes the lower electrode 132, the switch material pattern 140, the intermediate electrode 134, the variable resistance memory layer 150b, the buffer resistance layer 160b, and the upper electrode 136a, may have a circular horizontal cross-section, and a shape of the memory cell MCPb may be almost or roughly a cylinder. Each memory cell MCPb, which includes the lower electrode 132, the switch material pattern 140, the intermediate electrode 134, the variable resistance memory layer 150b, the buffer resistance layer 160b, and the upper electrode 136a, may extend from an upper portion to a lower portion and may have a tapered shape in which a horizontal width and a horizontal cross-section decrease (e.g., with increasing distance from the substrate 110 in the Z direction).

The buffer resistance layer 160b may surround the side walls of the variable resistance memory layer 150b. In an implementation, upper and lower surfaces of the variable resistance memory layer 150b may respectively contact the upper electrode 136a and the intermediate electrode 134, and the side walls of the variable resistance memory layer 150b may contact the buffer resistance layer 160b.

The variable resistance memory layer 150b may have a circular horizontal cross-section, and the buffer resistance layer 160b may have a ring-shaped horizontal cross-section surrounding a periphery of the variable resistance memory layer 150b. The variable resistance memory layer 150b may have concave recesses 150Rb in the upper surface of the variable resistance memory layer 150b. The upper surface of the variable resistance memory layer 150b may have a level decreasing from edges to a central portion to form the recess 150Rb. The upper electrode 136a may have a convex lower surface to fill the recess 150Rb of the variable resistance memory layer 150b. The buffer resistance layer 160b may extend from an upper portion to a lower portion in a straight line and may have an outer side wall having a decreasing horizontal width.

The buried insulating layer 175 may be between the memory cells MCPb on the first conductive lines 120. The buried insulating layer 175 may surround side walls of the lower electrode 132, the switch material pattern 140, the intermediate electrode 134, the buffer resistance layer 160b, and the upper electrode 136a that form each memory cell MCPb. The side walls of the lower electrode 132, the switch material pattern 140, and the intermediate electrode 134, outer side walls of the buffer resistance layer 160b, and the side walls of the upper electrode 136a, which form each memory cell MCPb, may be arranged in a straight line. The variable resistance memory layer 150b may be separated from the buried insulating layer 175 with the buffer resistance layer 160b therebetween. In some embodiments, the buried insulating layer 175 may include silicon nitride. In an implementation, the buried insulating layer 175 may have an upper surface that is at the same vertical level as the upper surface of the upper electrode 136a.

Figure 5A:
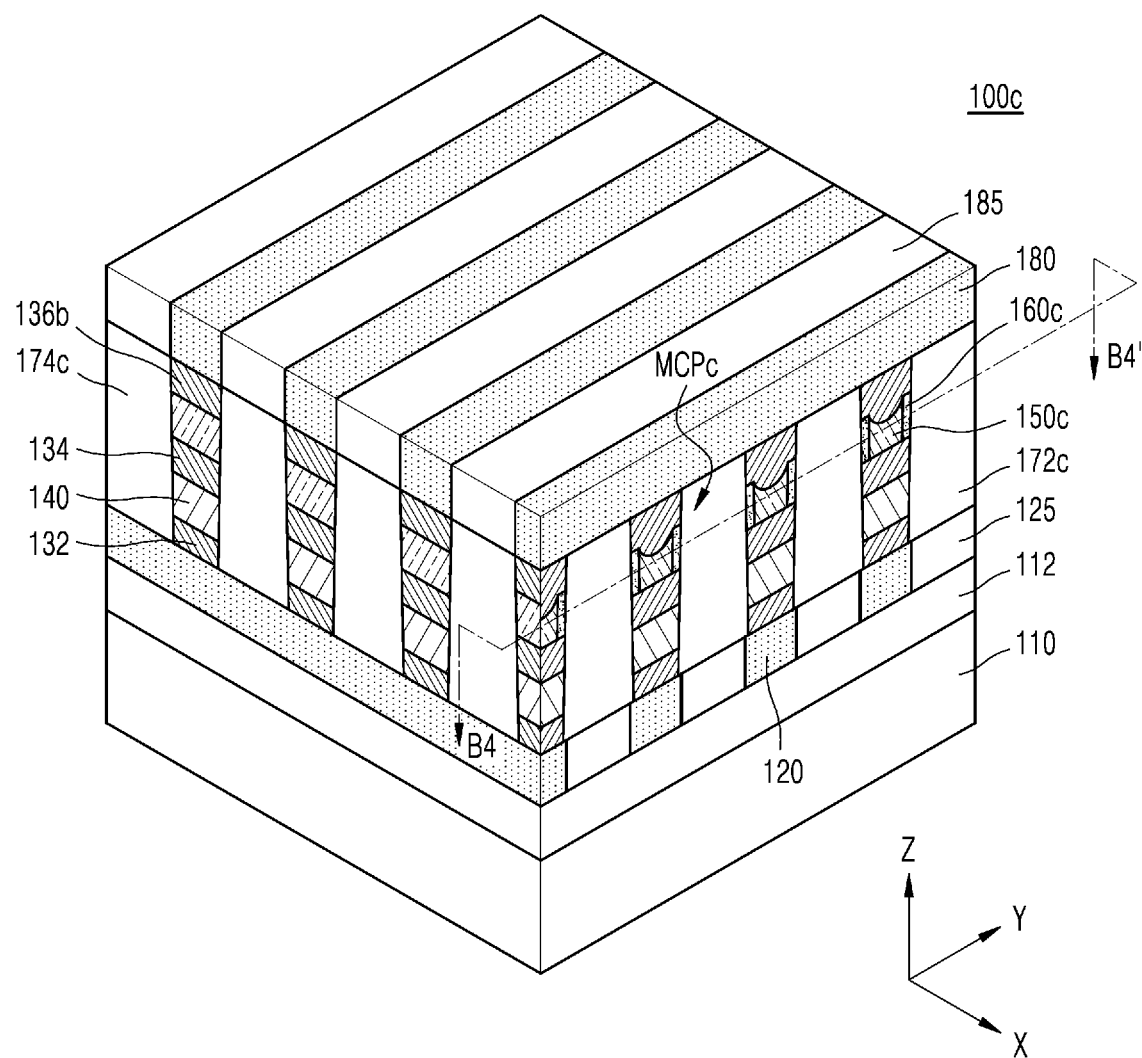
FIG. 5A is a perspective view of a memory device according to example embodiments.
Figure 5B:
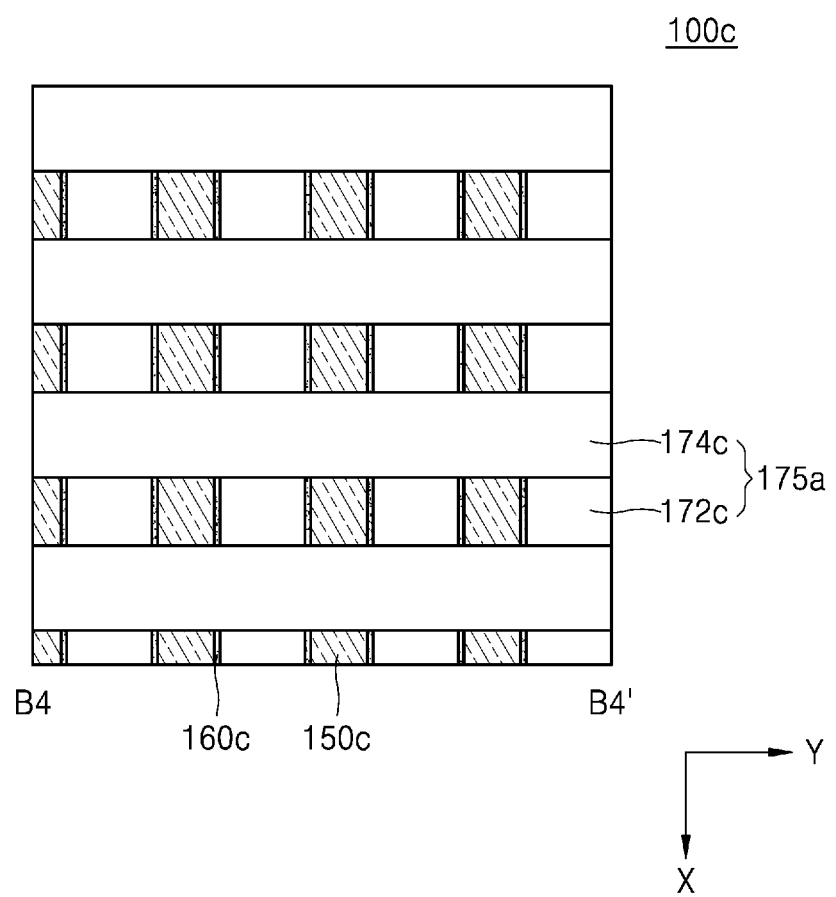
FIG. 5B is a cross-sectional view of the memory device taken along a line B4-B4' of FIG. 5A.

FIG. 5A is a perspective view of a memory device according to example embodiments, and FIG. 5B is a cross-sectional view of the memory device taken along a line B4-B4' of FIG. 5A. The same reference symbols as those in FIGS. 3A and 3B denote substantially the same elements in FIGS. 5A and 5B, and the descriptions provided with reference to FIGS. 3A, 3B, 4A, and 4B may be omitted.

Referring to FIGS. 5A and 5B, a memory device 100c may include the first conductive lines 120, the second conductive lines 180, and memory cells MCPc that are on the substrate 110. Each memory cell MCPc may include the lower electrode 132, the switch material pattern 140, the intermediate electrode 134, a variable resistance memory layer 150c, and an upper electrode 136b, which are sequentially on the first conductive line 120. Each memory cell MCPc may further include a buffer resistance layer 160c between the intermediate electrode 134 and the upper electrode 136b.

Each memory cell MCPc, which includes the lower electrode 132, the switch material pattern 140, the intermediate electrode 134, the variable resistance memory layer 150c, the buffer resistance layer 160c, and the upper electrode 136b, may have a square or rectangular horizontal cross-section, and a shape of the memory cell MCPc may be almost a square or rectangular pillar. Each memory cell MCPc, which includes the lower electrode 132, the switch material pattern 140, the intermediate electrode 134, the variable resistance memory layer 150c, the buffer resistance layer 160c, and the upper electrode 136b, may have a tapered shape extending from an upper portion to a lower portion and having a decreasing horizontal width and a decreasing horizontal cross-section.

In one memory cell MCPc, two buffer resistance layers 160c may cover both side walls of the variable resistance memory layer 150c. The variable resistance memory layer 150c may have a rectangular horizontal cross-section, and two buffer resistance layers 160c may each have a bar-shaped horizontal cross-section extending along both lateral sides of the variable resistance memory layer 150c. The variable resistance memory layer 150c may have concave recesses 150Rc in an upper surface thereof. The recesses 150Rc may extend in the first horizontal direction (the X direction), e.g., and inwardly from the upper surface of the variable resistance memory layer 150c. The upper electrode 136b may have a convex lower surface to fill the recess 150Rc of the variable resistance memory layer 150c. The buffer resistance layer 160c may extend from an upper portion to a lower portion in a straight line and have an outer side wall having a decreasing horizontal width.

On the first conductive lines 120, a buried insulating layer 175a may be between the memory cells MCPc. The buried insulating layer 175a may surround side walls of the lower electrode 132, the switch material pattern 140, the intermediate electrode 134, the variable resistance memory layer 150c, the buffer resistance layer 160c, and the upper electrode 136b that form each memory cell MCPc.

The buried insulating layer 175a may include a first buried insulating layer 172c and a second buried insulating layer 174c. The first buried insulating layer 172c may be between two adjacent memory cells MCPc from among the memory cells MCPc in the second horizontal direction (the Y direction). The first buried insulating layer 172c may contact the buffer resistance layer 160c, and may not contact the variable resistance memory layer 150c. The second buried insulating layer 174c may be between columns of the memory cells MCPc arranged in the second horizontal direction (the Y direction) and may extend in the second horizontal direction (the Y direction). The second buried insulating layer 174c may contact the variable resistance memory layer 150c and the buffer resistance layer 160c.

Figure 6A:
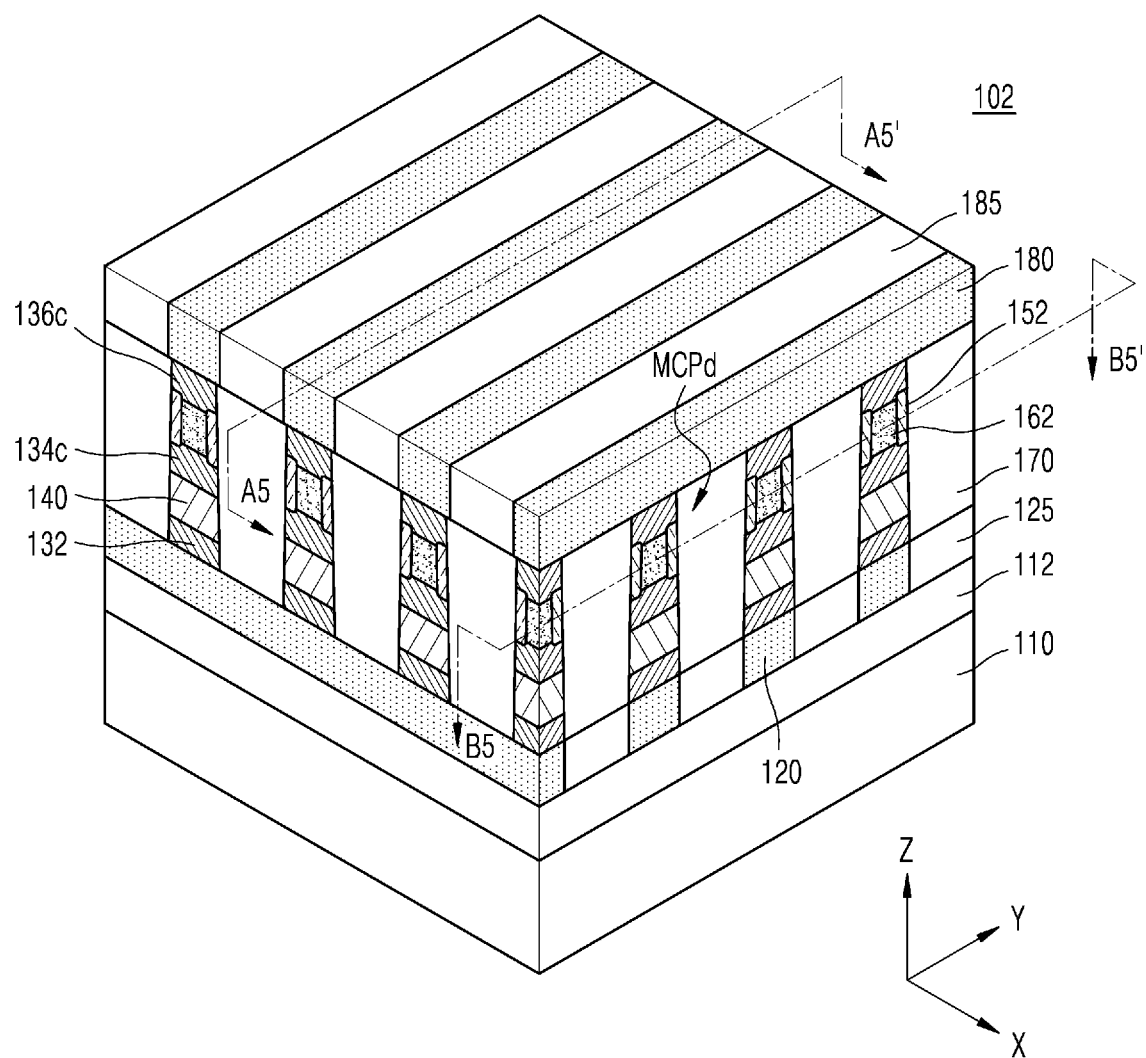
FIG. 6A is a perspective view of a memory device according to example embodiments.
Figure 6B:
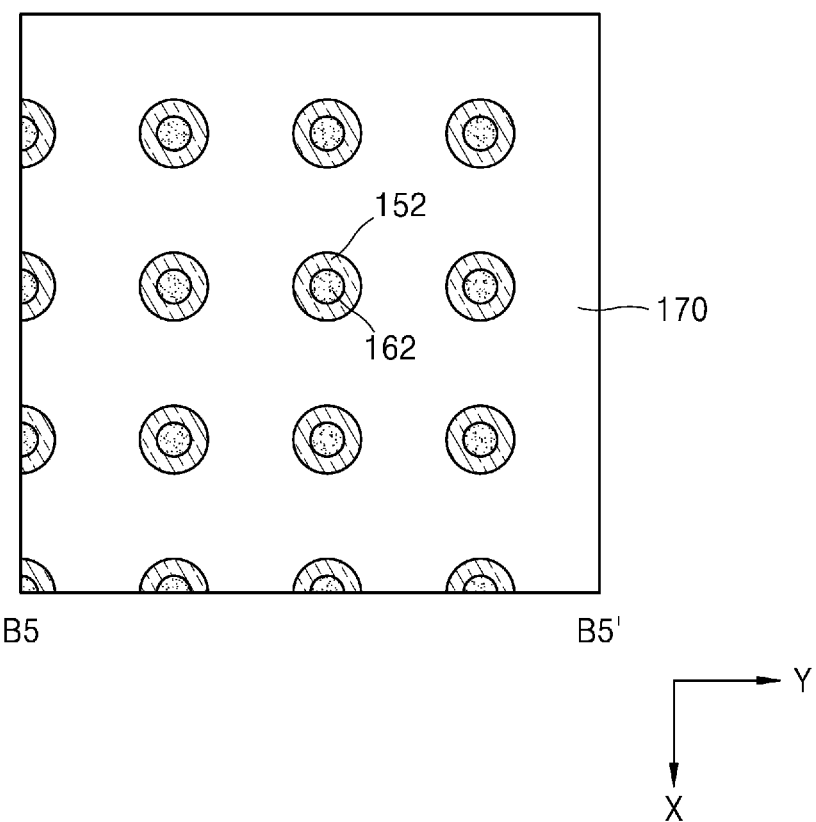
FIG. 6B is a cross-sectional view of the memory device taken along a line B5-B5' of FIG. 6A.

FIG. 6A is a perspective view of a memory device according to example embodiments, and FIG. 6B is a cross-sectional view of the memory device taken along a line B5-B5' of FIG. 6A. The same reference symbols as those in FIGS. 2A and 2B denote substantially the same elements in FIGS. 6A and 6B, and the descriptions provided with reference to FIGS. 2A and 2B may be omitted.

Referring to FIGS. 6A and 6B, a memory device 102 may include the first conductive lines 120, the second conductive lines 180, and memory cells MCPd that are on the substrate 110. Each memory cell MCPd may include the lower electrode 132, the switch material pattern 140, an intermediate electrode 134c, a variable resistance memory layer 152, and an upper electrode 136c that are sequentially stacked on the first conductive line 120. Each memory cell MCPd may further include a buffer resistance layer 162 between the intermediate electrode 134 and the upper electrode 136c.

Each memory cell MCPd, which includes the lower electrode 132, the switch material pattern 140, the intermediate electrode 134c, the variable resistance memory layer 152, the buffer resistance layer 162, and the upper electrode 136c, may have a circular horizontal cross-section, and a shape of the memory cell MCPd may be almost a cylinder (e.g., roughly cylindrical). Each memory cell MCPd, which includes the lower electrode 132, the switch material pattern 140, the intermediate electrode 134c, the variable resistance memory layer 152, the buffer resistance layer 162, and the upper electrode 136c, may have a tapered shape extending from a lower portion to an upper portion and having a decreasing horizontal width and a decreasing horizontal cross-section.

Each memory cell MCPd, which includes the lower electrode 132, the switch material pattern 140, the intermediate electrode 134c, the variable resistance memory layer 152, the buffer resistance layer 162, and the upper electrode 136c, may have a circular horizontal cross-section, and a shape of the memory cell MCPd may be almost a cylinder. Each memory cell MCPd, which includes the lower electrode 132, the switch material pattern 140, the intermediate electrode 134c, the variable resistance memory layer 152, the buffer resistance layer 162, and the upper electrode 136c, may have a tapered shape extending from the lower portion to the upper portion and having a decreasing horizontal width and a decreasing horizontal cross-section.

The buffer resistance layer 162 may surround the side walls of the variable resistance memory layer 150b. In an implementation, upper and lower surfaces of the variable resistance memory layer 150b may respectively contact the upper electrode 136a and the intermediate electrode 134, and the side walls of the variable resistance memory layer 150b may contact the buffer resistance layer 162.

The buffer resistance layer 162 may have a circular horizontal cross-section, and the variable resistance memory layer 152 may have a ring-shaped horizontal cross-section to surround a periphery of the buffer resistance layer 162. An upper surface of the variable resistance memory layer 152 may be at a higher vertical level than an upper surface of the buffer resistance layer 162, and a lower surface of the variable resistance memory layer 152 may be at a lower vertical level than a lower surface of the buffer resistance layer 162. In an implementation, a vertical height (e.g., measured in the Z direction) of the variable resistance memory layer 152 may be greater than that of the buffer resistance layer 162.

The intermediate electrode 134c may have an upper surface of which a central portion is more convex than edges to contact the lower surface of the buffer resistance layer 162, and the upper electrode 136c may have a lower surface of which a central portion is more convex than edges to contact the upper surface of the buffer resistance layer 162.

Figure 7A:
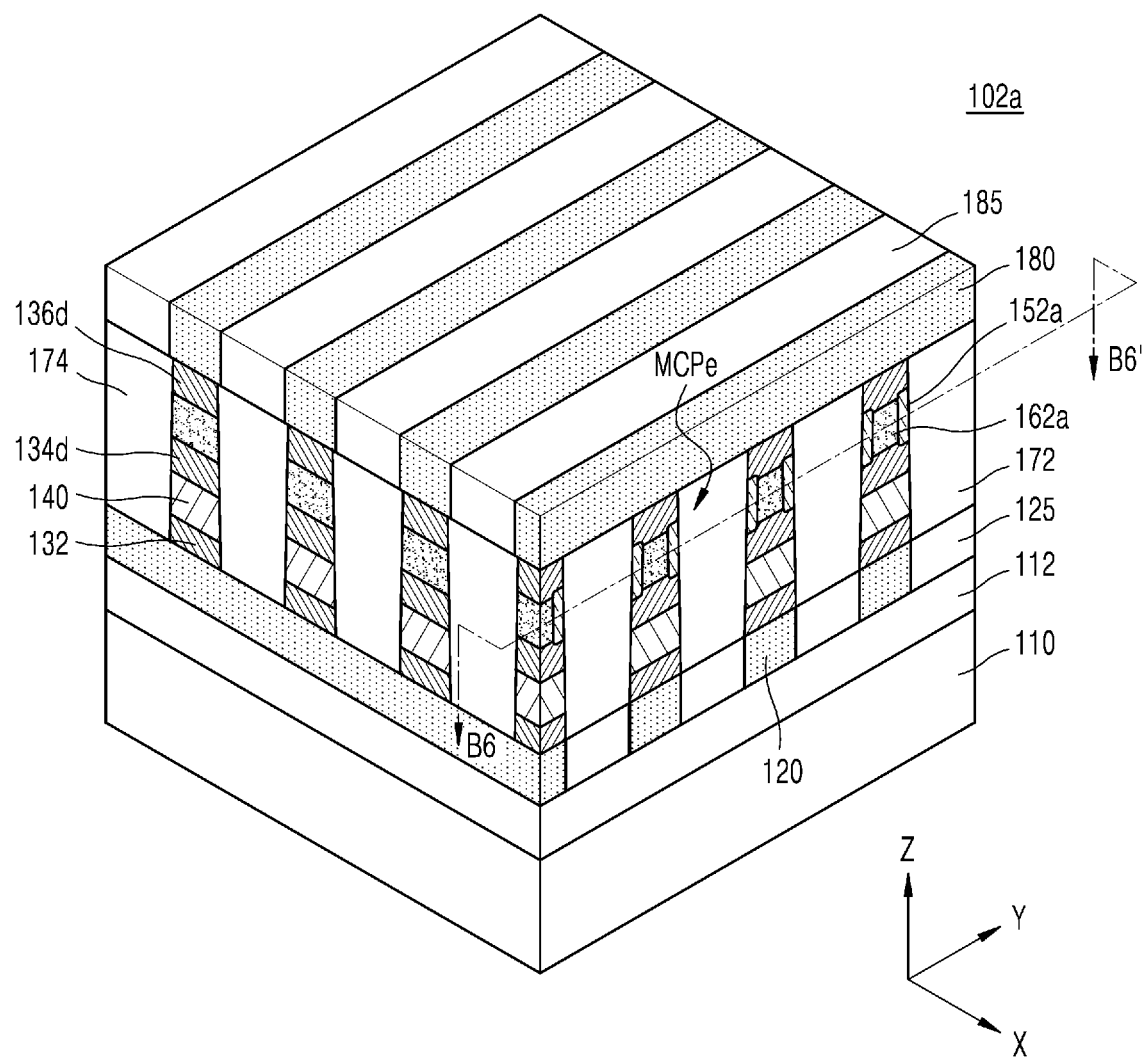
FIG. 7A is a perspective view of a memory device according to example embodiments.
Figure 7B:
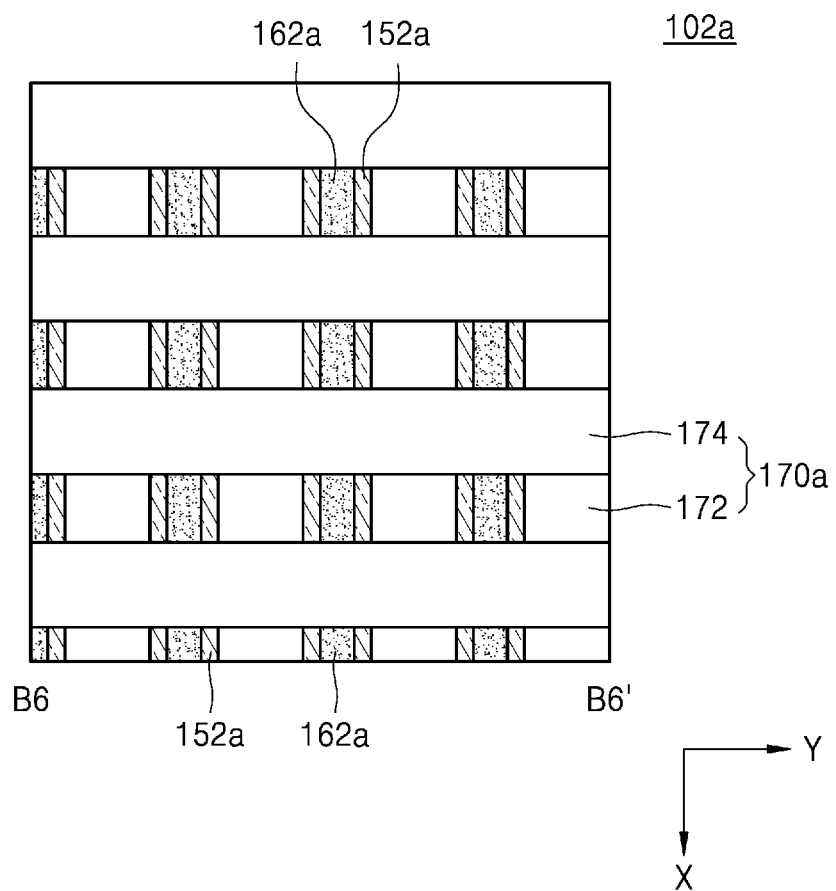
FIG. 7B is a cross-sectional view of the memory device taken along a line B6-B6' of FIG. 7A.

FIG. 7A is a perspective view of a memory device according to example embodiments, and FIG. 7B is a cross-sectional view of the memory device taken along a line B6-B6' of FIG. 7A. The same reference symbols as those in FIGS. 3A and 3B denote substantially the same elements in FIGS. 7A and 7B, and the descriptions provided with reference to FIGS. 3A, 3B, 6A, and 6B may be omitted.

Referring to FIGS. 7A and 7B, a memory device 102a may include the first conductive lines 120, the second conductive lines 180, and memory cells MCPe that are on the substrate 110. Each memory cell MCPe may include the lower electrode 132, the switch material pattern 140, an intermediate electrode 134d, a variable resistance memory layer 152a, and an upper electrode 136d which are sequentially on the first conductive lines 120. Each memory cell MCPe may further include a buffer resistance layer 162a between the intermediate electrode 134d and the upper electrode 136d.

Each memory cell MCPe, which includes the lower electrode 132, the switch material pattern 140, the intermediate electrode 134d, the variable resistance memory layer 152a, the buffer resistance layer 162a, and the upper electrode 136d, may have a square or rectangular horizontal cross-section, and a shape of each memory cell MCPe may be almost a square pillar (e.g., roughly a rectangular pillar). Each memory cell MCPe, which includes the lower electrode 132, the switch material pattern 140, the intermediate electrode 134d, the variable resistance memory layer 152a, the buffer resistance layer 162a, and the upper electrode 136d, may have a tapered shape extending from a lower portion to an upper portion and having a decreasing horizontal width and a decreasing horizontal cross-section.

In one memory cell MCPa, two variable resistance memory layers 152a may cover both side walls of the buffer resistance layer 162a. The buffer resistance layer 162a may have a rectangular horizontal cross-section, and two variable resistance memory layers 152a may each have a bar-shaped horizontal cross-section extending along both lateral sides of the buffer resistance layer 162a. An upper surface of the variable resistance memory layer 152a may be at a higher vertical level than an upper surface of the buffer resistance layer 162a, and a lower surface of the variable resistance memory layer 152a may be at a lower vertical level than a lower surface of the buffer resistance layer 162a. In an implementation, a vertical height of the variable resistance memory layer 152a may be greater than that of the buffer resistance layer 162a.

The intermediate electrode 134d may have an upper surface of which a central portion is more convex than edges (e.g., which protrudes) to contact the lower surface of the buffer resistance layer 162a, and the upper electrode 136d may have a lower surface of which a central portion is more convex than edges to contact the upper surface of the buffer resistance layer 162a.

Figure 8A:
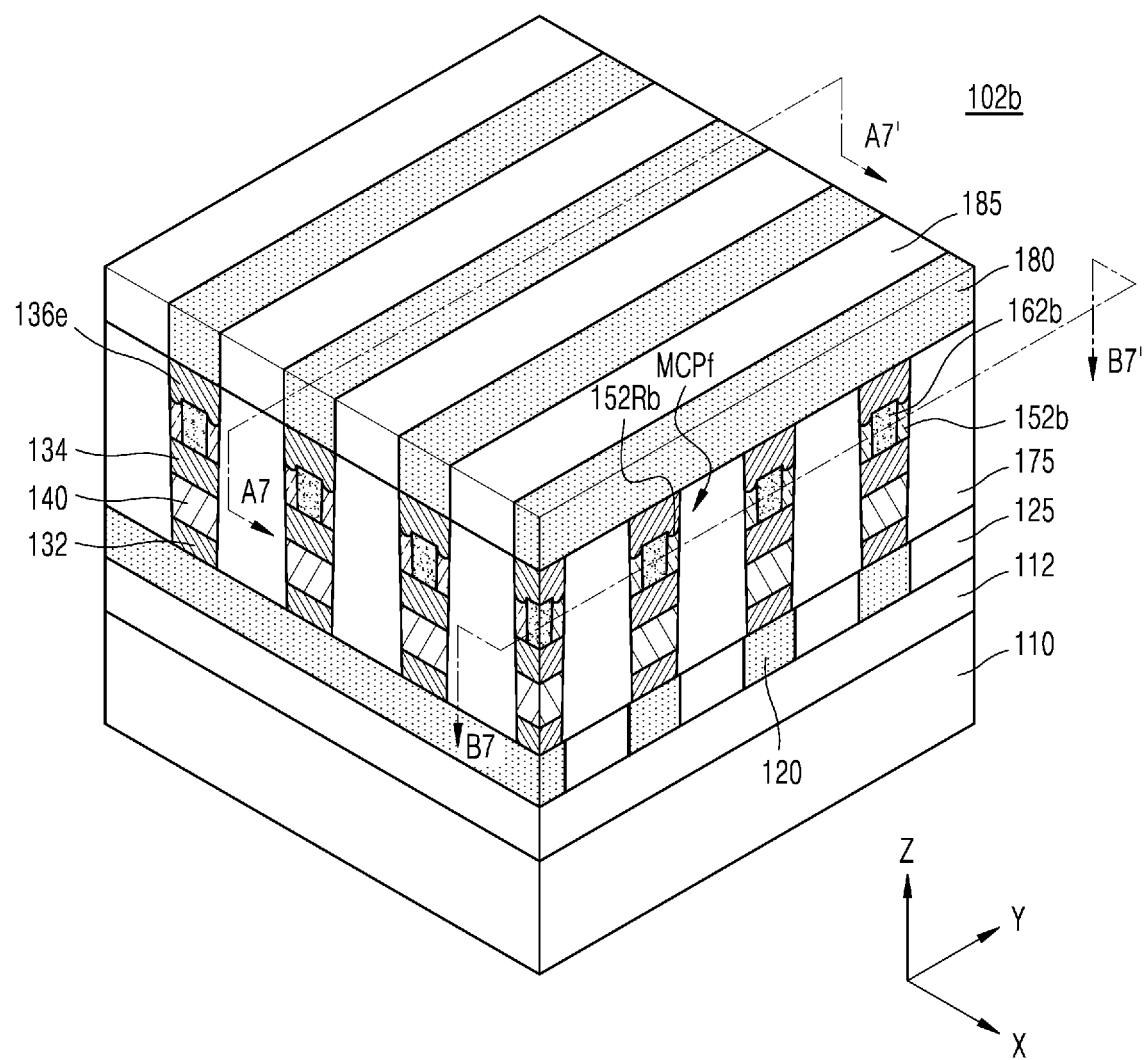
FIG. 8A is a perspective view of a memory device according to example embodiments.
Figure 8B:
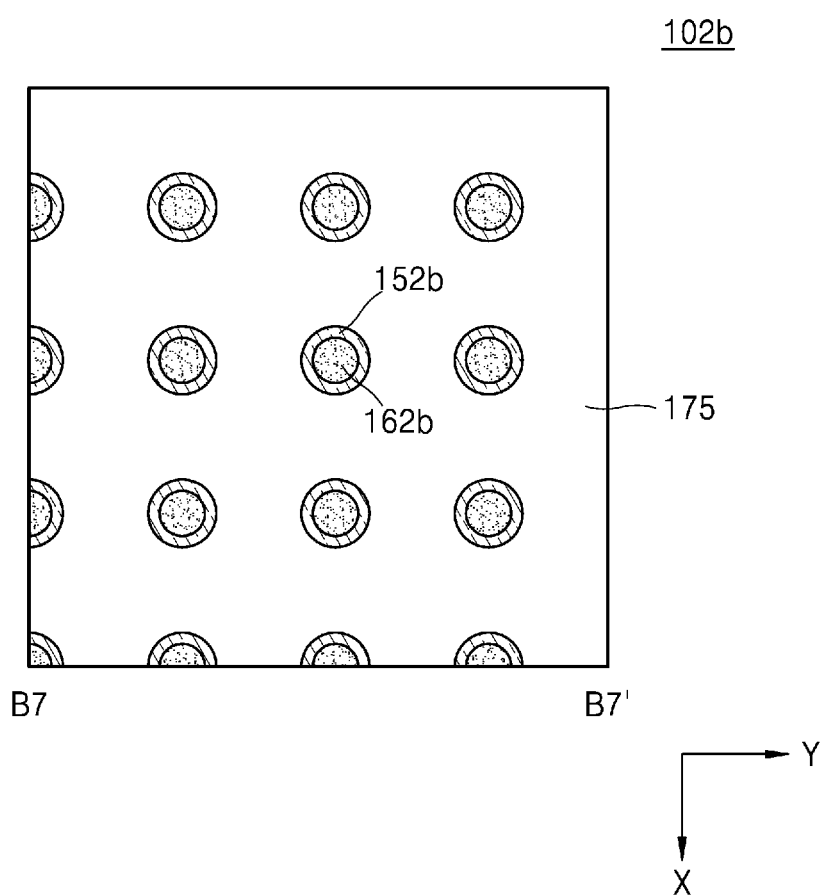
FIG. 8B is a cross-sectional view of the memory device taken along a line B7-B7' of FIG. 8A.

FIG. 8A is a perspective view of a memory device according to example embodiments, and FIG. 8B is a cross-sectional view of the memory device taken along a line B7-B7' of FIG. 8A. The same reference symbols as those in FIGS. 4A and 4B denote substantially the same elements in FIGS. 8A and 8B, and the descriptions provided with reference to FIGS. 4A, 4B, 6A, and 6B may be omitted.

Referring to FIGS. 8A and 8B, a memory device 102b may include the first conductive lines 120, the second conductive lines 180, and memory cells MCPf that are on the substrate 110. Each memory cell MCPf may include the lower electrode 132, the switch material pattern 140, the intermediate electrode 134, a variable resistance memory layer 152b, and an upper electrode 136e which are sequentially on the first conductive lines 120. Each memory cell MCPf may further include a buffer resistance layer 162b between the intermediate electrode 134 and the upper electrode 136e. The variable resistance memory layer 152b may surround side walls of the buffer resistance layer 162b.

Each memory cell MCPf, which includes the lower electrode 132, the switch material pattern 140, the intermediate electrode 134, the variable resistance memory layer 152b, the buffer resistance layer 162b, and the upper electrode 136e, may have a square or rectangular horizontal cross-section, and a shape of each memory cell MCPf may be almost a square or rectangular pillar. Each memory cell MCPf, which includes the lower electrode 132, the switch material pattern 140, the intermediate electrode 134, the variable resistance memory layer 152b, the buffer resistance layer 162b, and the upper electrode 136e, may have a tapered shape extending from an upper portion to a lower portion and having a decreasing horizontal width and a decreasing horizontal cross-section.

The variable resistance memory layer 152b may surround the side walls of the buffer resistance layer 162b. In an implementation, upper and lower surfaces of the buffer resistance layer 162b may contact the upper electrode 136e and the intermediate electrode 134, respectively, and the side walls of the buffer resistance layer 162b may contact the variable resistance memory layer 152b.

The buffer resistance layer 162b may have a circular horizontal cross-section, and the variable resistance memory layer 152b may have a ring-shaped horizontal cross-section that surrounds a periphery of the buffer resistance layer 162b. An upper surface of the variable resistance memory layer 152b may be at a lower level than the upper surface of the buffer resistance layer 162b, and a lower surface of the variable resistance memory layer 152b may be at the same vertical level as (e.g., coplanar with) the lower surface of the buffer resistance layer 162b. In an implementation, a vertical height of the variable resistance memory layer 152b may be less than that of the buffer resistance layer 162b.

In an implementation, the upper electrode 136e may have a lower surface of which a central portion is more concave than edges to contact (e.g., conformally contact) the upper surface of the buffer resistance layer 162b.

Figure 9A:
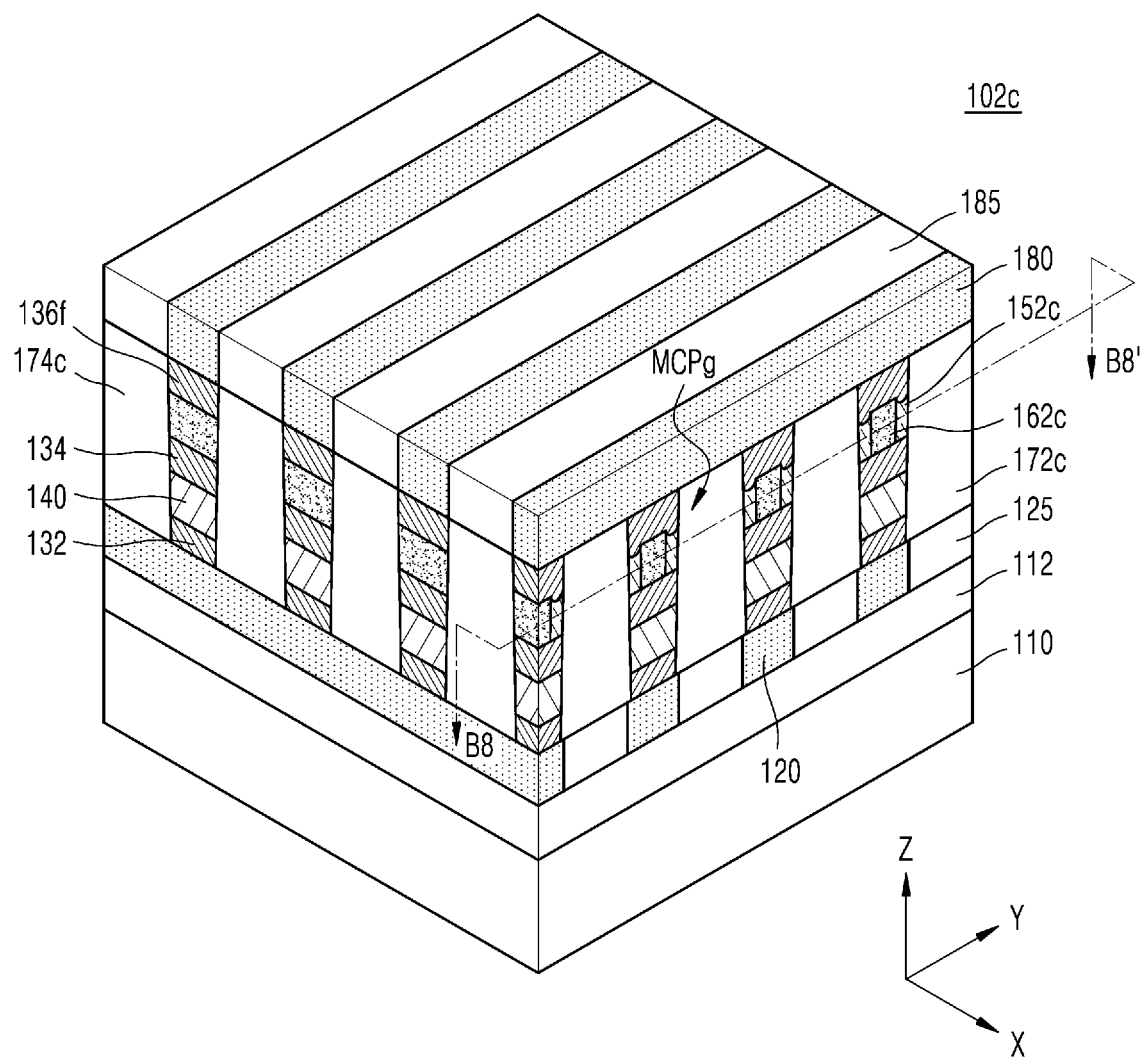
FIG. 9A is a perspective view of a memory device according to example embodiments.
Figure 9B:
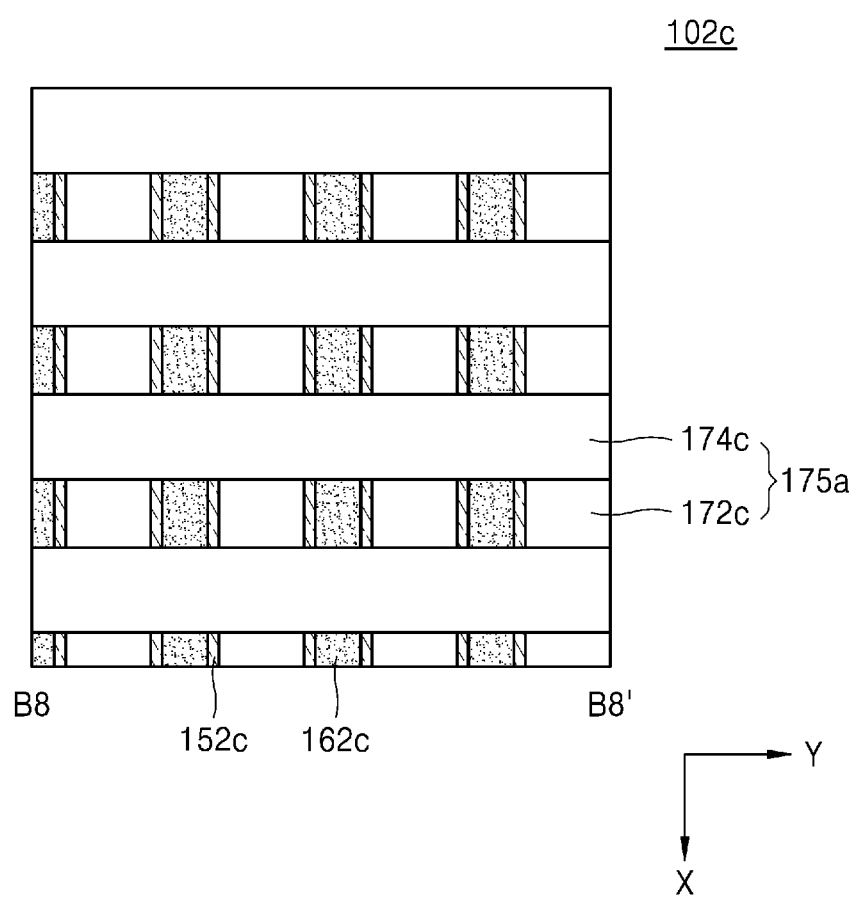
FIG. 9B is a cross-sectional view of the memory device taken along a line B8-B8' of FIG. 9A.

FIG. 9A is a perspective view of a memory device according to example embodiments, and FIG. 9B is a cross-sectional view of the memory device taken along a line B8-B8' of FIG. 9A. The same reference symbols as those in FIGS. 5A and 5B denote substantially the same elements in FIGS. 9A and 9B, and the descriptions provided with reference to FIGS. 5A, 5B, 8A, and 8B may be omitted.

Referring to FIGS. 9A and 9B, a memory device 102c may include the first conductive lines 120, the second conductive lines 180, and memory cells MCPg that are on the substrate 110. Each memory cell MCPg may include the lower electrode 132, the switch material pattern 140, the intermediate electrode 134, a variable resistance memory layer 152c, and an upper electrode 136f which are sequentially on the first conductive line 120. Each memory cell MCPg may further include a buffer resistance layer 162c between the intermediate electrode 134 and the upper electrode 136f.

Each memory cell MCPg, which includes the lower electrode 132, the switch material pattern 140, the intermediate electrode 134, the variable resistance memory layer 152c, the buffer resistance layer 162c, and the upper electrode 136f, may have a roughly square horizontal cross-section, and a shape of each memory cell MCPg may be roughly a square pillar. Each memory cell MCPg, which includes the lower electrode 132, the switch material pattern 140, the intermediate electrode 134, the variable resistance memory layer 152c, the buffer resistance layer 162c, and the upper electrode 136f, may have a tapered shape extending from an upper portion to a lower portion and having a decreasing horizontal width and a decreasing horizontal cross-section.

In one memory cell MCPg, two variable resistance memory layers 152c may cover both side walls of the buffer resistance layer 162c. The buffer resistance layer 162c may have a rectangular horizontal cross-section, and two variable resistance memory layers 152c may each have a bar-shaped horizontal cross-section that extends along lateral sides of the buffer resistance layer 162c. An upper surface of the variable resistance memory layer 152c may be at a lower vertical level than an upper surface of the buffer resistance layer 162c, and a lower surface of the variable resistance memory layer 152c may be at the same vertical level as a lower surface of the buffer resistance layer 162c. In an implementation, a vertical height of the variable resistance memory layer 152c may be less than that of the buffer resistance layer 162c.

The upper electrode 136f may have a lower surface of which a central portion is more concave than edges to accommodate and contact the upper surface of the buffer resistance layer 162c.

FIGS. 10A to 10G are cross-sectional views of processes to describe a manufacturing method of a memory device, according to example embodiments. In detail, FIGS. 10A to 10G are cross-sectional views of a memory device taken along a line A1-A1' of FIG. 2A.

Figure 10A:
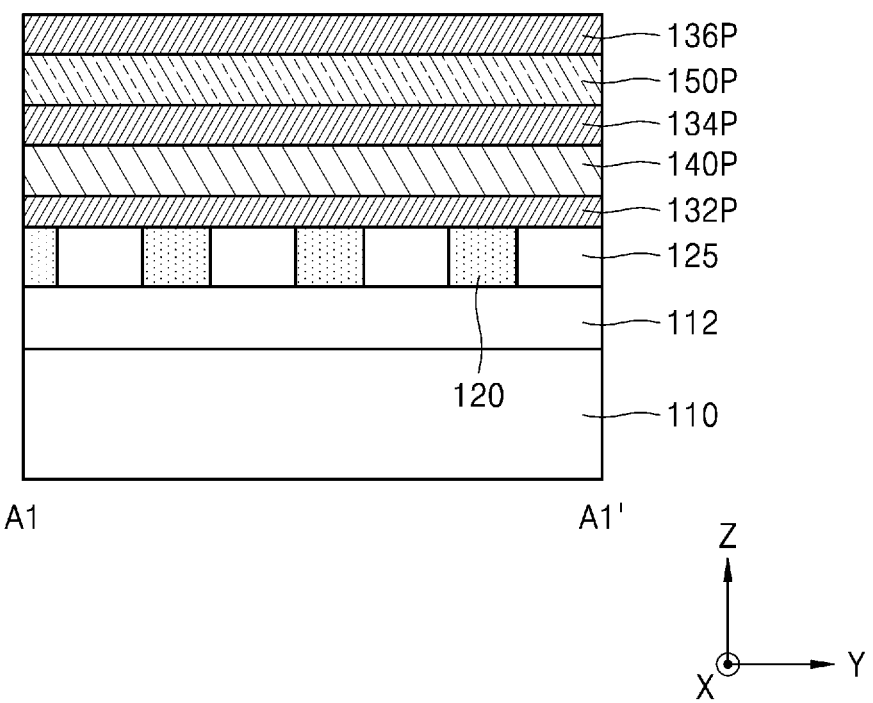
FIGS. 10A to 10G are cross-sectional views of stages in a manufacturing method of a memory device, according to example embodiments.

Referring to FIG. 10A, the interlayer insulating layer 112 and the first conductive lines 120 may be formed on the substrate 110, and then first insulating layers 125 may be formed to fill gaps between the first conductive lines 120, respectively. After a first conductive material layer covering the interlayer insulating layer 112 is formed, the first conductive lines 120 may be formed by patterning the first conductive material layer. The first conductive lines 120 may be formed on the interlayer insulating layer 112 to extend (e.g., lengthwise) in the first horizontal direction (the X direction).

Then, a lower electrode material layer 132P, a switch material layer 140P, an intermediate electrode material layer 134P, a variable resistance material layer 150P, and an upper electrode material layer 136P may be sequentially formed on the first conductive line 120 and the first insulating layer 125.

Figure 10B:
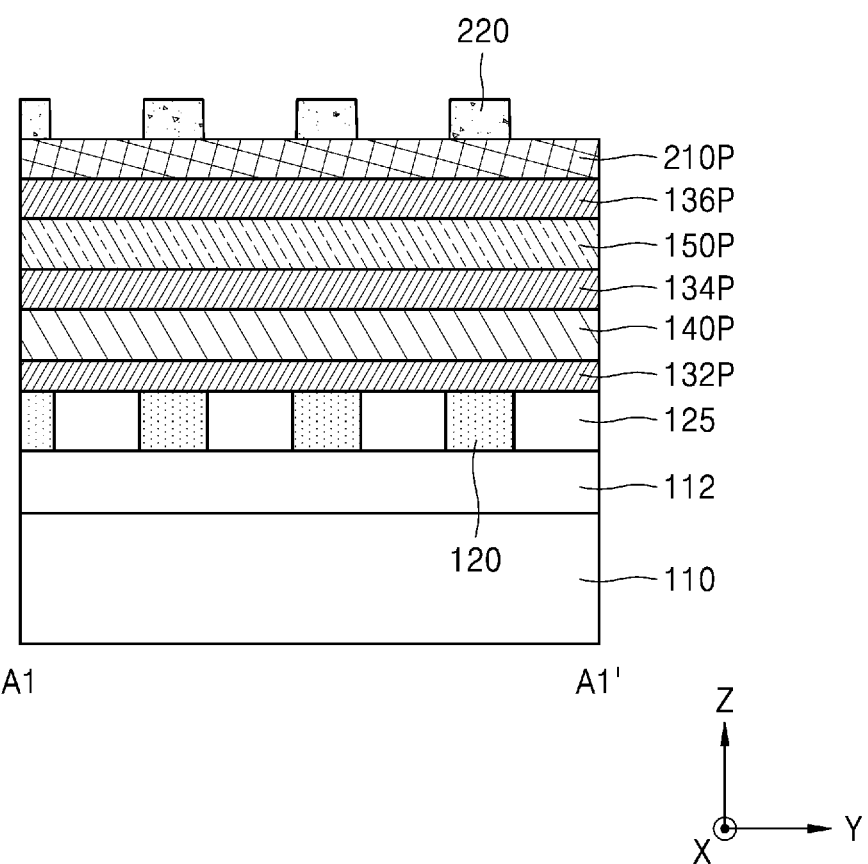

Referring to FIG. 10B, a protection mask material layer 210P covering the upper electrode material layer 136P and hard mask patterns 220 on the protection mask material layer 210P may be formed. The hard mask patterns 220 may each have a circular horizontal cross-section and may be apart from each other on the protection mask material layer 210P. In an implementation, each hard mask pattern 220 may include an oxide, and the protection mask material layer 210P may include a nitride.

Figure 10C:
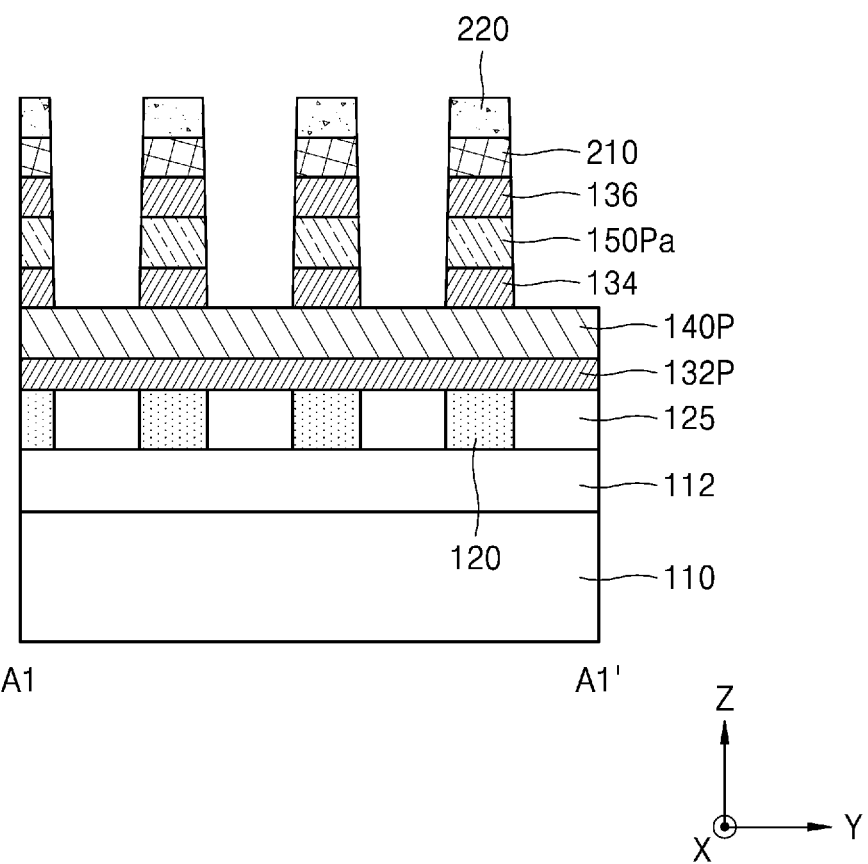

Referring to FIGS. 10B and 10C, patterning may be performed to remove respective portions of the protection mask material layer 210P, the upper electrode material layer 136P, the variable resistance material layer 150P, and the intermediate electrode material layer 134P by using the hard mask pattern 220 as an etch mask, and the protection mask patterns 210, the upper electrodes 136, the variable resistance patterns 150Pa, and the intermediate electrodes 134 may be formed. In this case, the switch material layer 140P may not be patterned. In an implementation, to help prevent the exposure of the switch material layer 140P, the intermediate electrode material layer 134P may not be separated into the intermediate electrodes 134 by removing the upper portion of the intermediate electrode material layer 134P.

Each of stack structures, which include the protection mask patterns 210, the upper electrodes 136, the variable resistance patterns 150Pa, and the intermediate electrodes 134, may have a tapered shape extending from a lower portion to an upper portion and a decreasing horizontal width and a decreasing horizontal cross-section.

Figure 10D:
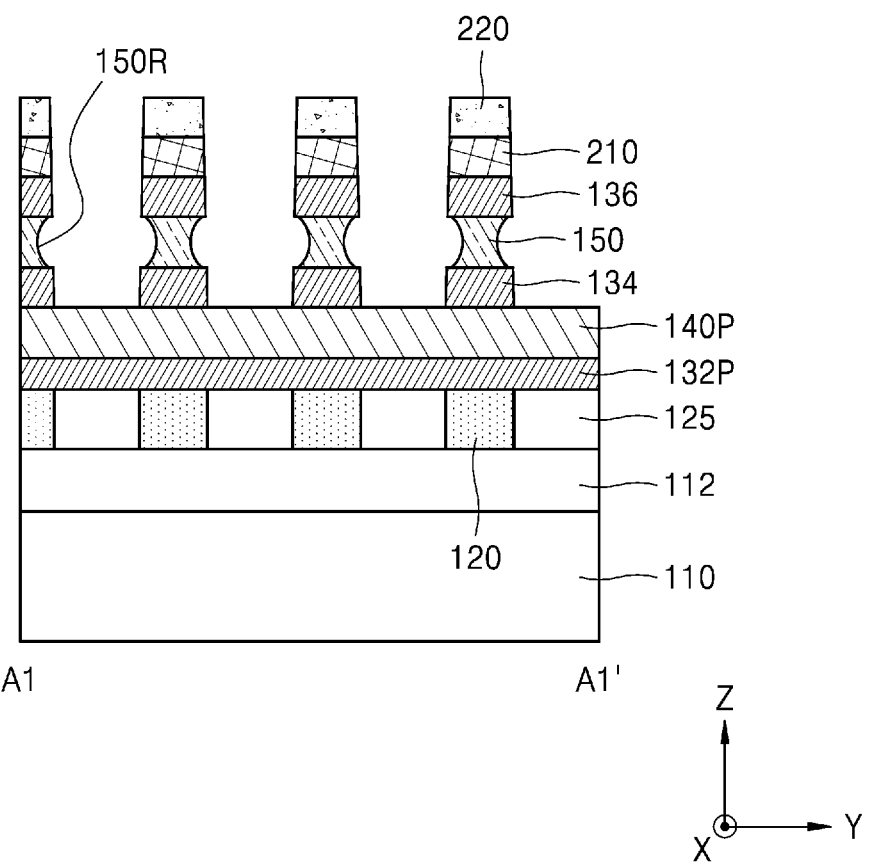

Referring to FIGS. 10C and 10D, by selectively removing portions of the variable resistance patterns 150Pa, the variable resistance memory layers 150 may be formed in portions of spaces between the intermediate electrodes 134 and the upper electrodes 136. In an implementation, the variable resistance memory layers 150 may be formed by performing an etch-back process in an etch gas atmosphere in which the variable resistance patterns 150Pa may be selectively removed. In an implementation, the variable resistance memory layer 150 may be formed by performing a wet etching process using an etching solution used to selectively remove the variable resistance patterns 150Pa.

The recesses 150R may be concavely formed in the side walls of the variable resistance memory layer 150. The recesses 150R may surround the variable resistance memory layer 150 along the side walls of the variable resistance memory layer 150.

Figure 10E:
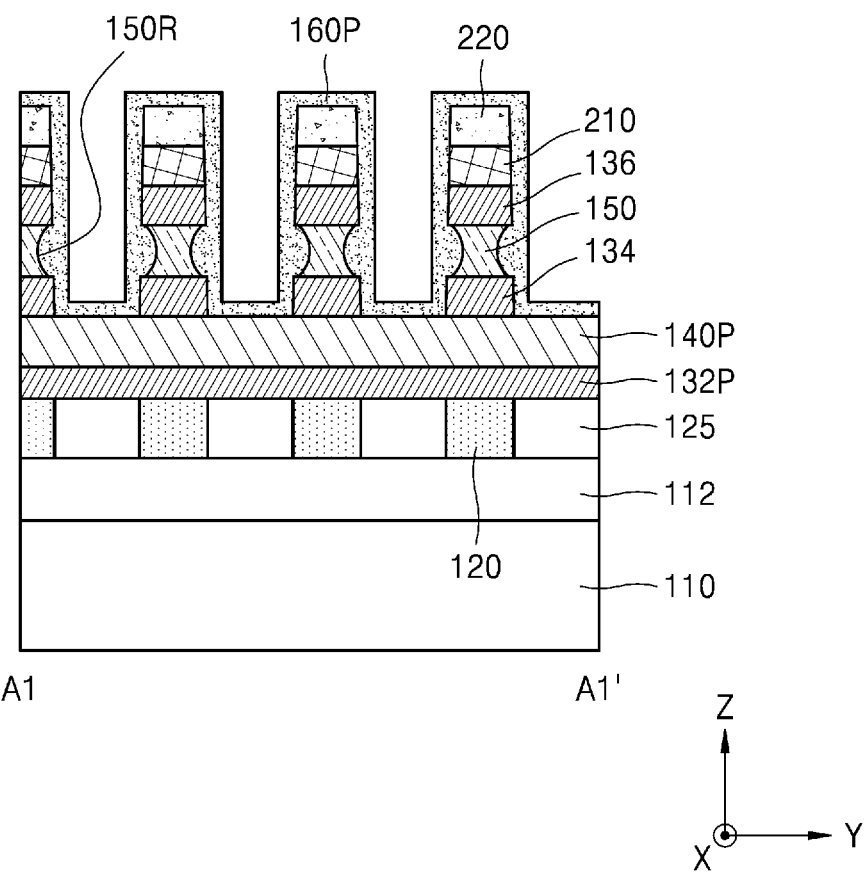

Referring to FIG. 10E, a buffer resistance material layer 160P may be formed to fill the recesses 150R. The buffer resistance material layer 160P may fill portions between the intermediate electrode 134 and the upper electrode 136, other than the variable resistance memory layer 150, and may conformally cover an exposed surface including a side surface of each of the intermediate electrode 134 and the upper electrode 136.

Figure 10F:
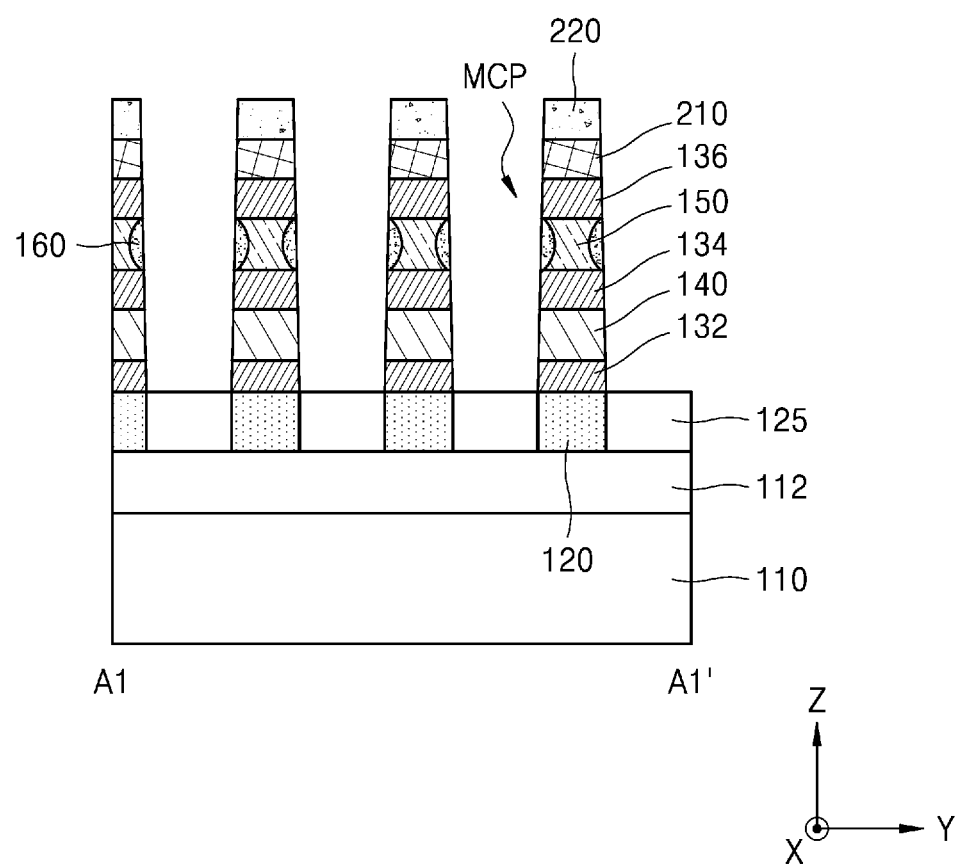

Referring to FIGS. 10E and 10F, the memory cells MCP, each of which includes the lower electrode 132, the switch material pattern 140, the intermediate electrode 134, the variable resistance memory layer 150, the buffer resistance layer 160, and the upper electrode 136, may be formed by removing portions of the buffer resistance material layer 160P. The buffer resistance layer 160 may be formed by removing portions of the buffer resistance material layer 160P other than portions filling a space between the intermediate electrode 134 and the upper electrode 136. In an implementation, the buffer resistance layer 160 may be formed as portions of the buffer resistance material layer 160P, which fill the space between the intermediate electrode 134 and the upper electrode 136, only remain. The buffer resistance layer 160 may have a ring-shaped horizontal cross-section surrounding the periphery of the variable resistance memory layer 150. The buffer resistance layer 160 may have an inner side wall that is convex to fill the recess 150R of the variable resistance memory layer 150.

Each memory cell MCP may have a tapered shape extending from the lower portion to the upper portion and the decreasing horizontal width and horizontal cross-section.

Figure 10G:
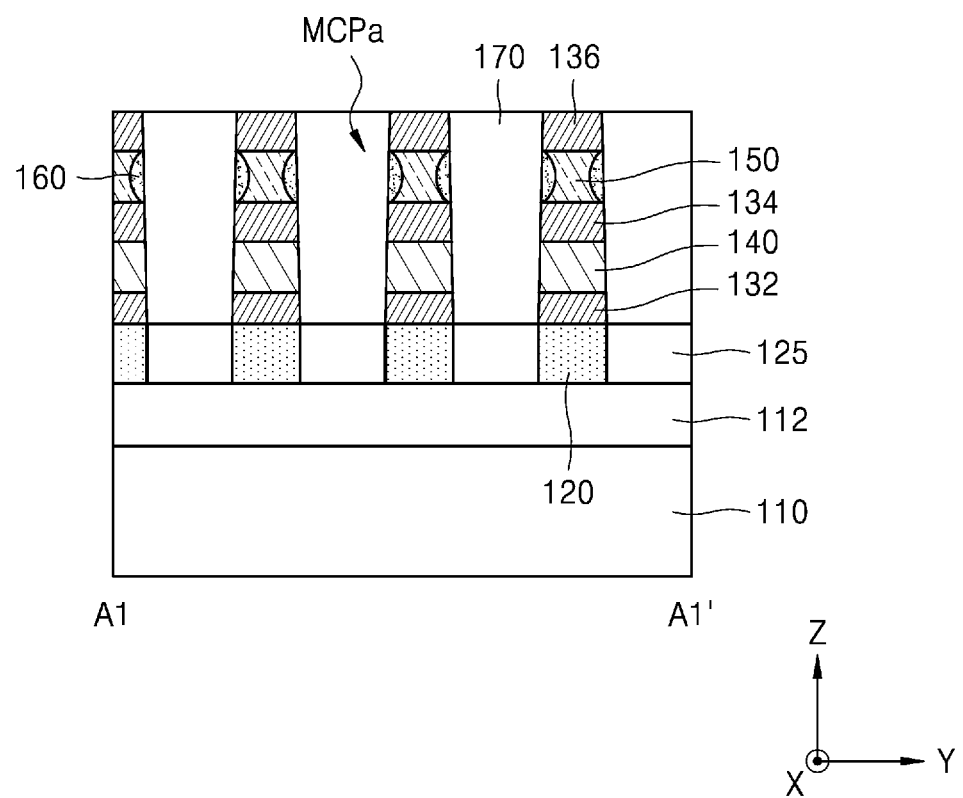

Referring to FIGS. 10F and 10G, the buried insulating layer 170 may be formed to fill spaces between the memory cells MCP. The buried insulating layer 170 may be formed by forming a buried insulating material layer, which fills the gaps between the memory cells MCP and covers a result of FIG. 10F, and removing an upper portion of the buried insulating material layer, the hard mask patterns 220, the protection mask patterns 210 to expose the upper electrode 136. The buried insulating layer 170 may be formed by performing a planarization process, e.g., a CMP process.

Then, as shown in FIG. 2A, the second conductive lines 180, which may be respectively connected to the upper electrodes 136 of the memory cells MCP, and the second insulating layers 185 filling gaps between the second conductive lines 180 may be formed on the memory cells MCP and the buried insulating layer 170, thereby forming the memory device 100.

In an implementation, the memory device 100a of FIGS. 3A and 3B may be formed with reference to the manufacturing method of FIGS. 10A to 10G. For example, the hard mask patterns 220 of FIG. 10B may have line shapes extending in the first horizontal direction (the X direction), and after performing a method similar to the method of FIGS. 10C to 10E, a buried insulating material layer for forming the first buried insulating layer 172 may be formed by covering the result. The memory cells MCPa may be formed by separating portions of the first conductive lines 120 and the first insulating layer 125 among portions, on which the buried insulating material layer is formed, into line shapes extending in the second horizontal direction (the Y direction), and then the second buried insulating layer 172, the second conductive lines 180, and the second insulating layer 185 are formed, thereby forming the memory device 100a. In an implementation, the memory device 100c of FIGS. 5A and 5B, the memory device 102a of FIGS. 7A and 7B, and the memory device 102c of FIGS. 9A and 9B may be formed with reference to a manufacturing method of FIGS. 11A to 11H, a manufacturing method of FIGS. 12A to 12F, a manufacturing method of FIGS. 13A to 13D, and the manufacturing method of the memory device 100a of FIGS. 3A and 3B.

FIGS. 11A to 11H are cross-sectional views sequentially showing processes to describe a manufacturing method of a memory device, according to example embodiments. FIGS. 11A to 11H are example cross-sectional views of a memory device taken along a line A3-A3' of FIG. 4A. The same reference symbols as those in FIGS. 10A to 10G denote substantially the same elements in FIGS. 11A to 11H, and the descriptions provided with reference to FIGS. 10A to 10G may be omitted.

Figure 11A:
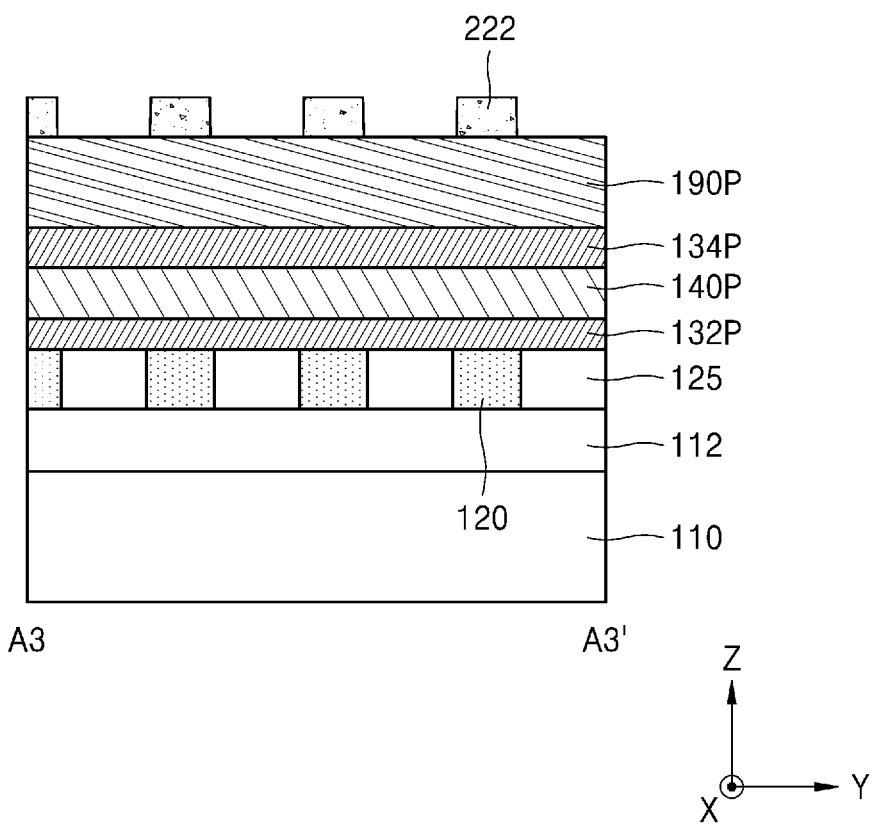
FIGS. 11A to 11H are cross-sectional views of stages in a manufacturing method of a memory device, according to example embodiments.

Referring to FIG. 11A, the interlayer insulating layer 112, the first conductive lines 120, the first insulating layer 125 filling the gaps between the first conductive lines 120, the lower electrode material layer 132P sequentially covering the first conductive lines 120 and the first insulating layer 125, the switch material layer 140P, the intermediate electrode material layer 134P, and a mold material layer 190P covering the intermediate electrode material layer 134P are formed on the substrate 110, and the hard mask patterns 222 may be formed on the mold material layer 190P.

Figure 11B:
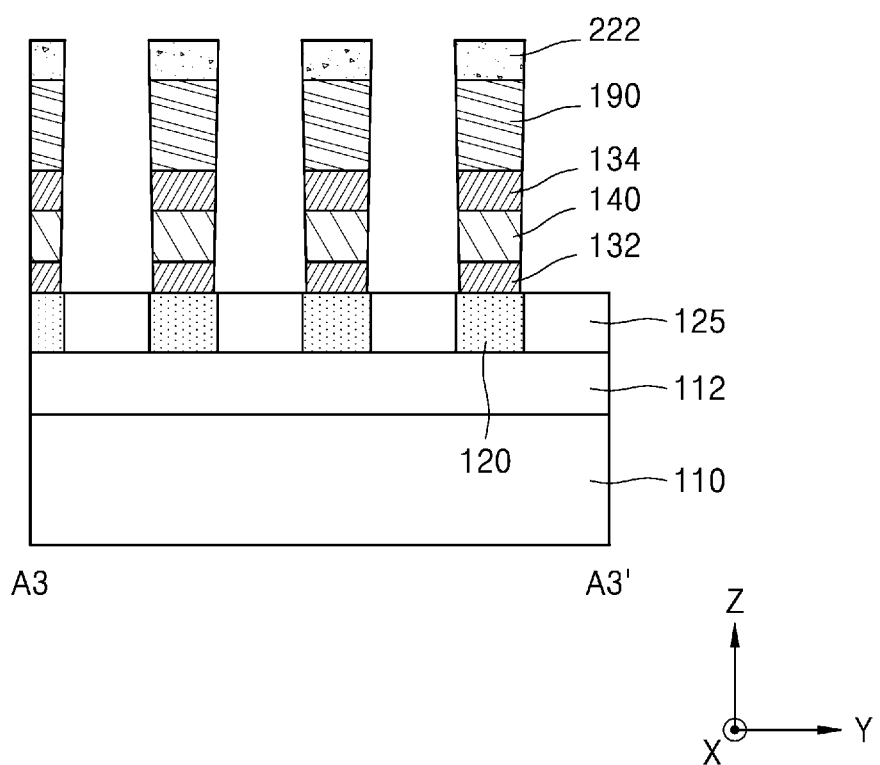
Figure 11C:
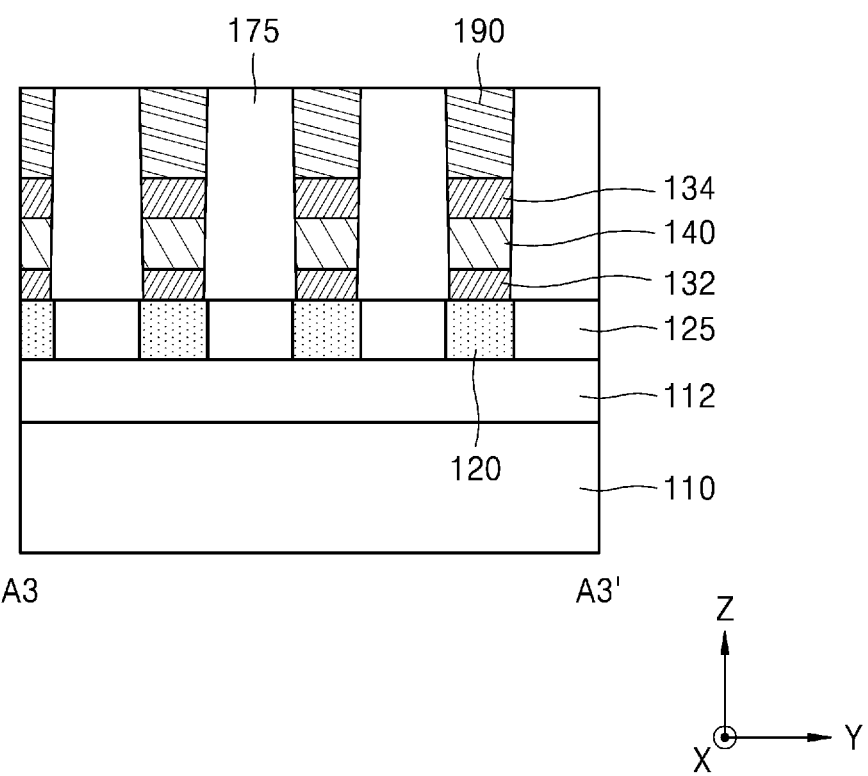

The mold material layer 190P may include a material having a etch selectivity to the intermediate electrode material layer 134P and the buried insulating layer (175 of FIG. 11C). The mold material layer 190P may include, e.g., silicon oxide, SiC, SiC:H, SiCN, SiCN:H, SiOCN, SiOCN:H, SiOC, an Amorphous Carbon Layer (ACL), or a Spin-On Hardmark (SOH).

The hard mask patterns 222 may each have a circular horizontal cross-section and may be separated from each other. The hard mask patterns 222 may each include an oxide.

In an implementation, before the hard mask patterns 222 are formed, the protection mask material layer (210P of FIG. 10B) covering the mold material layer 190P may be further formed.

Referring to FIGS. 11A and 11B, patterning may be performed to remove respective portions of the mold material layer 190P, the intermediate electrode material layer 134P, the switch material layer 140P, and the lower electrode material layer 132P by using the hard mask patterns 220 as etch masks, and mold patterns 190, the intermediate electrodes 134, the switch material patterns 140, and the lower electrodes 132 may be formed.

Referring to FIG. 11C, the buried insulating layer 175 may be formed to fill gaps between the lower electrodes 132, the switch material patterns 140, the intermediate electrodes 134, and the mold patterns 190. The buried insulating layer 175 may be formed by forming, e.g., the buried insulating material layer covering the result of FIG. 11B, and then performing the planarization process such as a CMP process so that the mold patterns 190 are exposed. In the process of performing the planarization process in which the buried insulating layer 175 is formed, the hard mask patterns (222 of FIG. 11B) may be removed.

Figure 11D:
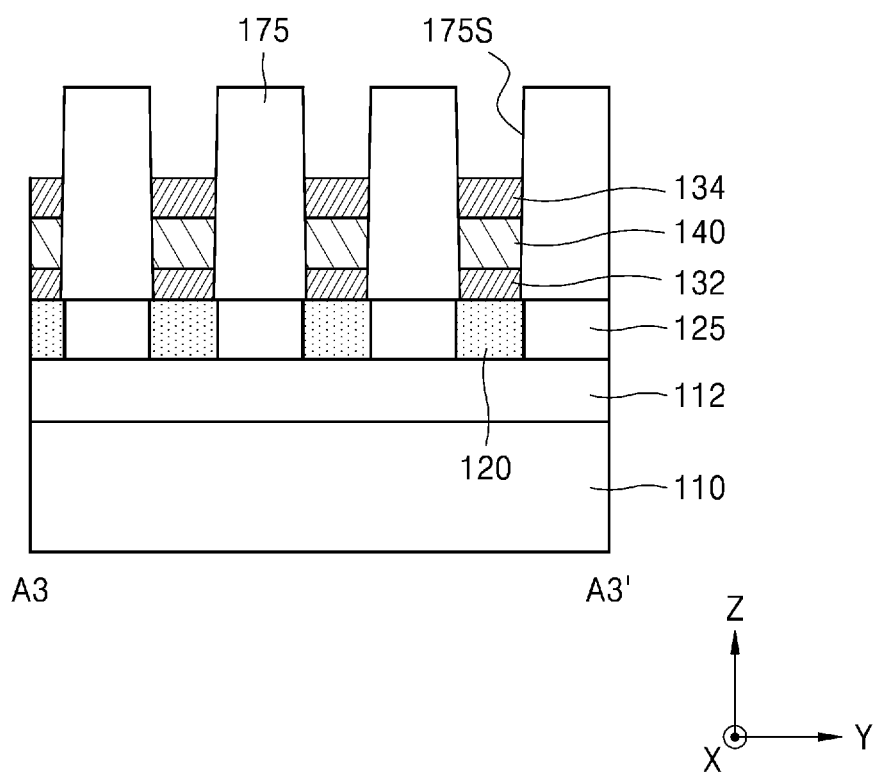

Referring to FIGS. 11C and 11D, the first spaces 175S limited by the buried insulating layer 175 may be formed in the intermediate electrodes 134 by removing the mold patterns 190.

Figure 11E:
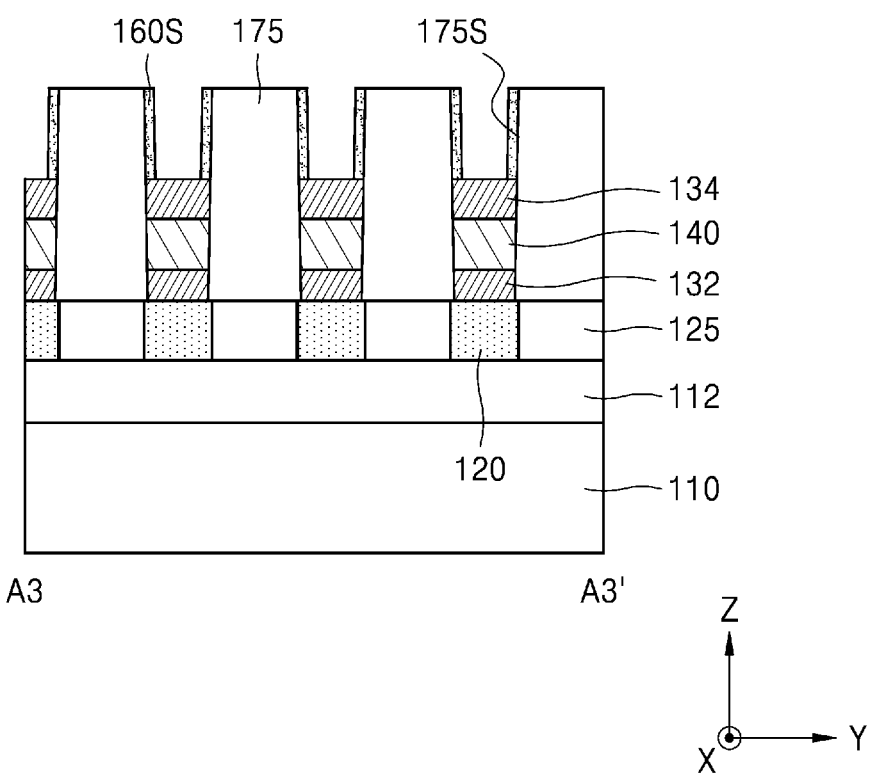

Referring to FIG. 11E, buffer resistance spacers 160S covering inner side walls of the first spaces 175S may be formed. The buffer resistance spacer 160S may be formed by forming the buffer resistance material layer, which conformally covers the inner side walls and bottom surfaces of the first spaces 175S and the upper surface of the buried insulating layer 175, and removing portions of the buffer resistance material layer, which cover the bottom surfaces of the first spaces 175S and the upper surface of the buried insulating layer 175, through anisotropic etching.

Figure 11F:
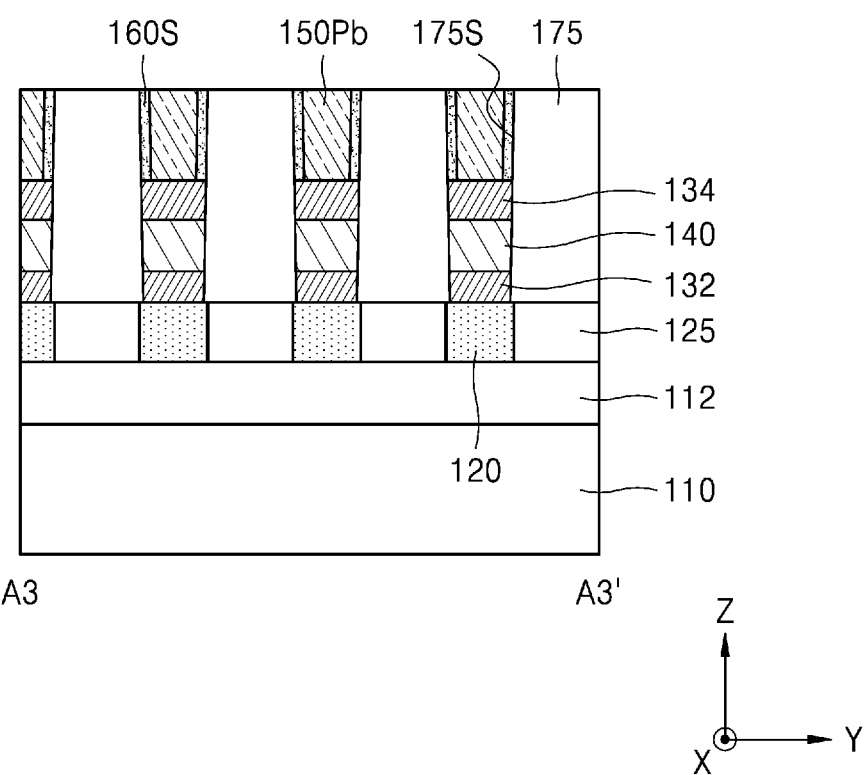
Figure 11G:
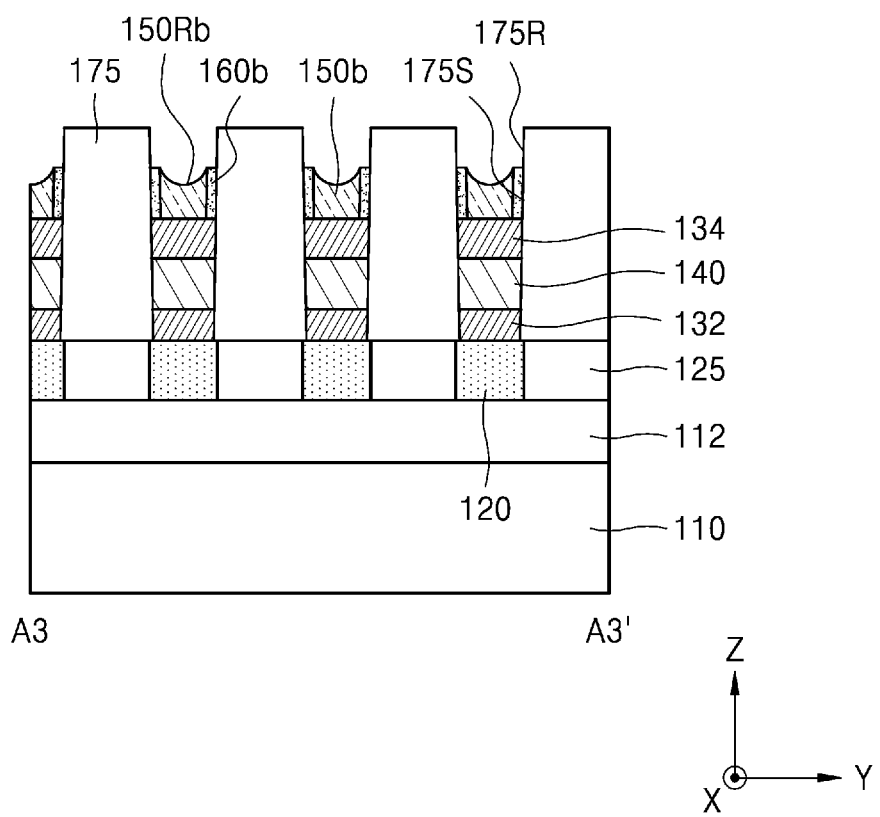

Referring to FIGS. 11F and 11G, after the variable resistance material patterns 150Pb filling the first spaces 175S are formed, the variable resistance memory layer 150*b* and the buffer resistance layer 160*b* may be formed by removing upper portions of the variable resistance material patterns 150Pb and the buffer resistance spacers 160S. Second spaces 175R limited by the buried insulating layer 175 may be formed in the variable resistance memory layer 150*b* and the buffer resistance layer 160*b*. The second spaces 175R may be upper portions of the first spaces 175S.

In a process of removing the upper portions of the variable resistance material patterns 150Pb and the buffer resistance spacers 160S to form the variable resistance memory layer 150*b* and the buffer resistance layer 160*b*, portions of the variable resistance material patterns 150Pb may be removed more than those of the buffer resistance spacers 160S, and the concave recesses 150Rb may be formed in the upper surface of the variable resistance memory layer 150*b*. The bottom surface of the recess 150Rb may be at a lower level than (e.g., closer to the substrate 110 in the Z direction than) the upper portion of the buffer resistance layer 160*b*.

In an implementation, as shown in FIG. 11F, instead of forming the variable resistance material patterns 150Pb filling the first spaces 175S, the variable resistance material layer filling the first spaces 175S and the upper surface of the buried insulating layer 175 may be formed. Then, the variable resistance memory layer 150*b* and the buffer resistance layer 160*b* may be formed by removing the portion of the variable resistance material layer, which covers the upper surface of the buried insulating layer 175, other portions of the variable resistance material layer, which fill the upper portions of the first spaces 175S, and the upper portions of the buffer resistance spacers 160S.

Figure 11H:
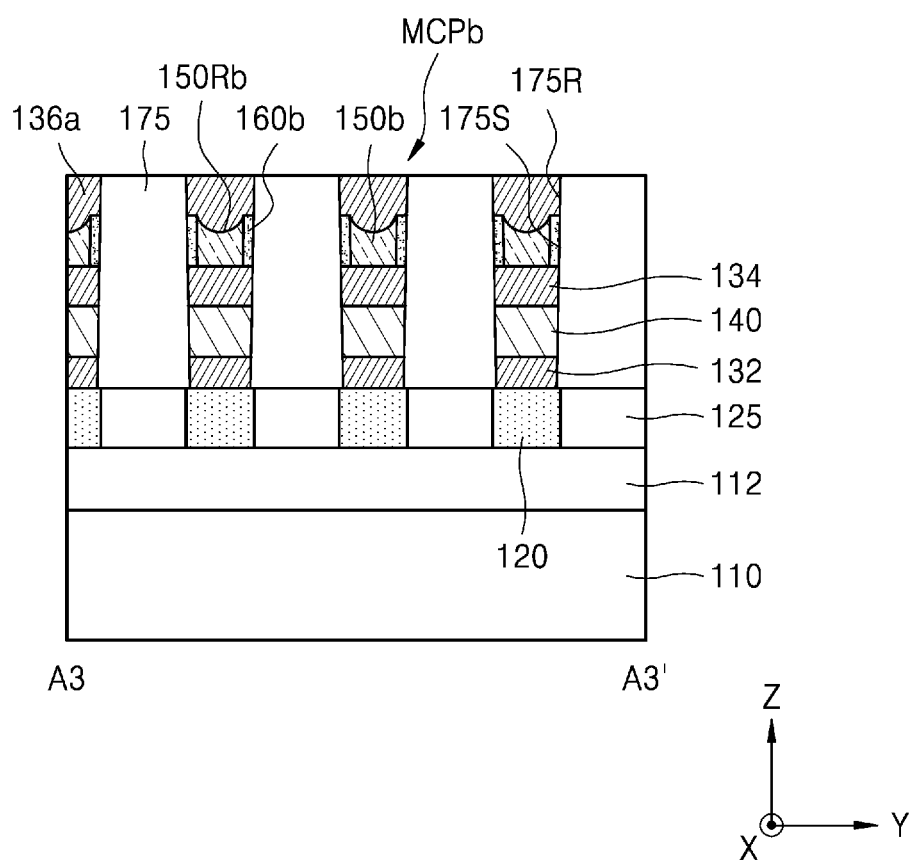

Referring to FIG. 11H, the upper electrodes 136*a* filling the second spaces 175R may be formed on the variable resistance memory layer 150*b* and the buffer resistance layer 160*b*, and the memory cells MCPb, each of which includes the lower electrode 132, the switch material pattern 140, the intermediate electrode 134, the variable resistance memory layer 150*b*, the buffer resistance layer 160*b*, and the upper electrode 136*a*, may be formed. The upper electrodes 136*a* may be formed by forming the upper electrode material layer, which fills the second spaces 175R and the upper surface of the buried insulating layer 175, and removing portions of the upper electrode material layer to expose the upper surface of the buried insulating layer 175. The upper electrode 136*a* may have a convex lower surface to fill the recesses 150Rb of the variable resistance memory layer 150*b*.

Then, as shown in FIG. 4A, the memory device 100*b* may be formed by forming, on the memory cells MCPb and the buried insulating layer 175, the second conductive lines 180 respectively connected to the upper electrodes 136*a* of the memory cells MCPb and the second insulating layers 185 filling the gaps between the second conductive lines 180.

FIGS. 12A to 12F are cross-sectional views sequentially showing processes to describe a manufacturing method of a memory device, according to example embodiments. In detail, FIGS. 12A to 12F are example cross-sectional views taken along a line A5-A5' of FIG. 6A. The same reference symbols as those in FIGS. 10A to 10G denote substantially the same elements in FIGS. 12A to 12F, and the descriptions provided with reference to FIGS. 10A to 10G may be omitted.

Figure 12A:
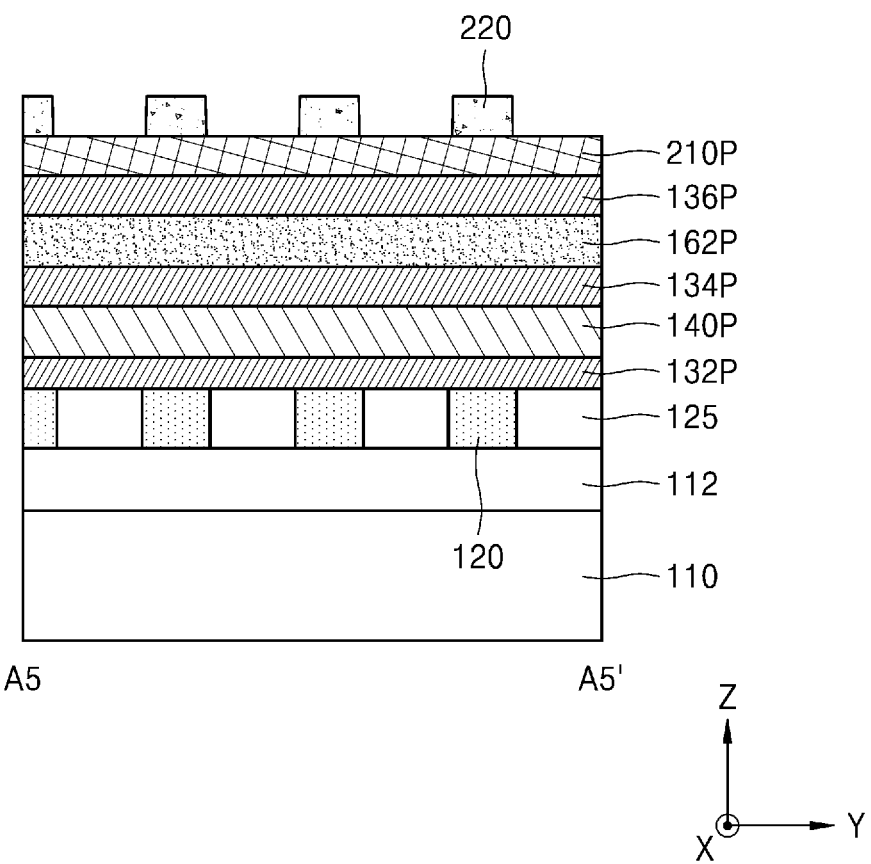
FIGS. 12A to 12F are cross-sectional views of stages in a manufacturing method of a memory device, according to example embodiments.

Referring to FIG. 12A, the interlayer insulating layer 112, the first conductive lines 120, the first insulating layer 125 filling respective gaps between the first conductive lines 120, the lower electrode material layer 132P, which covers the first conductive lines 120 and the first insulating layer 125, the switch material layer 140P, the intermediate electrode material layer 134P, the buffer resistance material layer 162P, the upper electrode material layer 136P, the protection mask material layer 210P, and the hard mask patterns 220 disposed on the protection mask material layer 210P may be formed on the substrate 110.

Figure 12B:
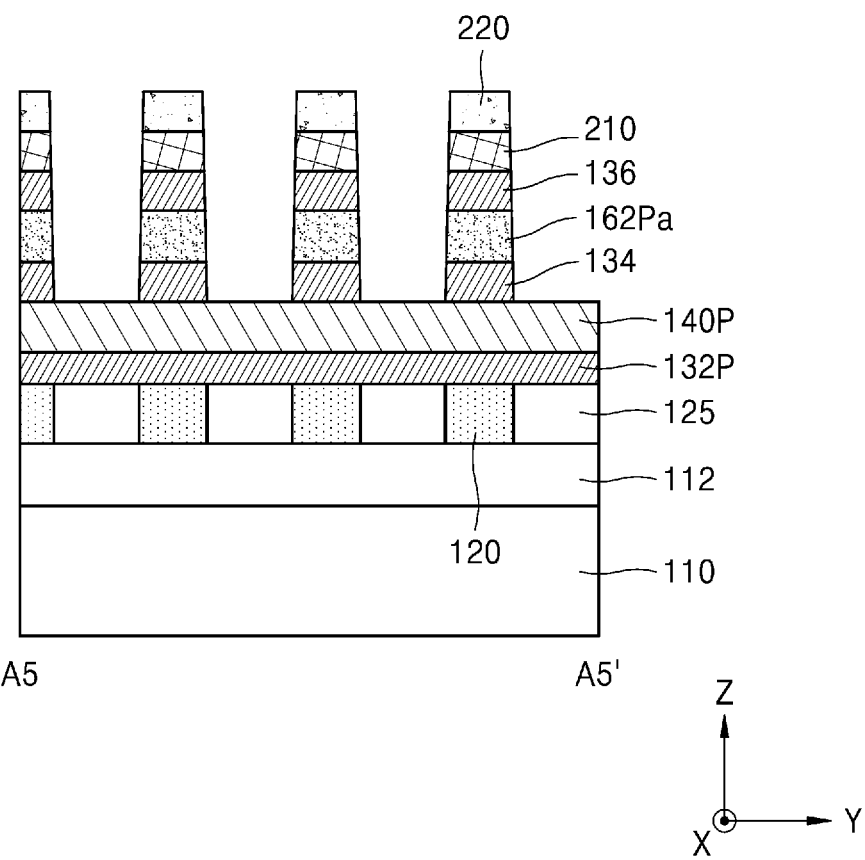

Referring to FIGS. 12A and 12B, patterning may be performed to remove respective portions of the protection mask material layer 210P, the upper electrode material layer 136P, the buffer resistance material layer 162P, and the intermediate electrode material layer 134P by using the hard mask patterns 220 as etch masks, and the protection mask patterns 210, the upper electrodes 136, the buffer resistance patterns 162Pa, and the intermediate electrodes 134 may be formed. In this case, the switch material layer 140P may not be patterned. In an implementation, to prevent the exposure of the switch material layer 140P, the intermediate electrode material layer 134P may not be separated into the intermediate electrodes 134 by removing the upper portion of the intermediate electrode material layer 134P.

Figure 12C:
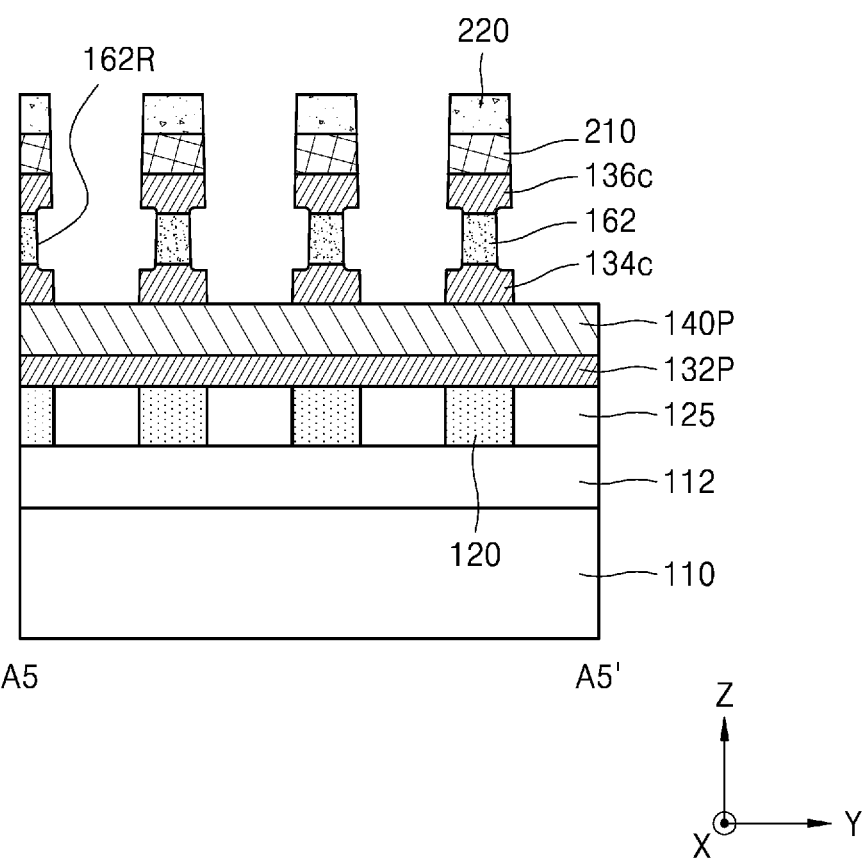

Referring to FIGS. 12B and 12C, the buffer resistance layers 162 may be formed in portions of gaps between the intermediate electrodes 134 and the upper electrodes 136 by selectively removing portions of the buffer resistance patterns 162Pa. In an implementation, the buffer resistance layers 162 may be formed by performing an etch-back process in an etching gas atmosphere in which the buffer resistance patterns 162Pa may be selectively removed. In an implementation, the buffer resistance layers 162 may be formed by performing a wet etching process using an etching solution used to selectively remove the buffer resistance pattern 162Pa.

In an implementation, in a process of removing portions of the buffer resistance pattern 162Pa, the upper portion of the intermediate electrode 134 and the lower portion of the upper electrode 136 may be removed together, and the intermediate electrode 134c having an upper surface, of which a central portion is convex, and the upper electrode 136c having a lower surface, of which a central portion is convex, may be formed.

The recesses 162R may be formed between the intermediate electrode 134c and the upper electrode 136c, the recesses being regions where the portion of the buffer resistance pattern 162Pa, the upper portion of the intermediate electrode 134, and the lower portion of the upper electrode 136 have been removed. The recess 162R may surround the buffer resistance layer 162 along the side walls of the buffer resistance layer 162.

Figure 12D:
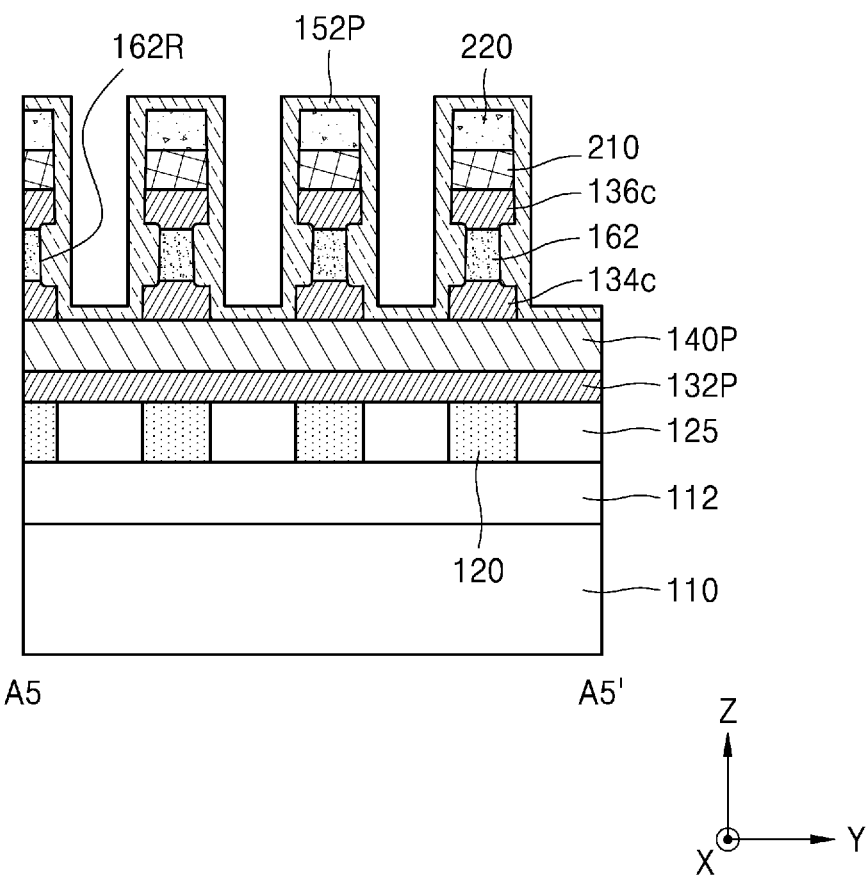

Referring to FIG. 12D, the variable resistance material layer 152P filling the recess 162R may be formed. The variable resistance material layer 152P may fill portions between the intermediate electrode 134c and the upper electrode 136c, other than the buffer resistance layer 162, and may conformally cover an exposed surface including side surfaces of the intermediate electrode 134c and the upper electrode 136c.

Figure 12E:
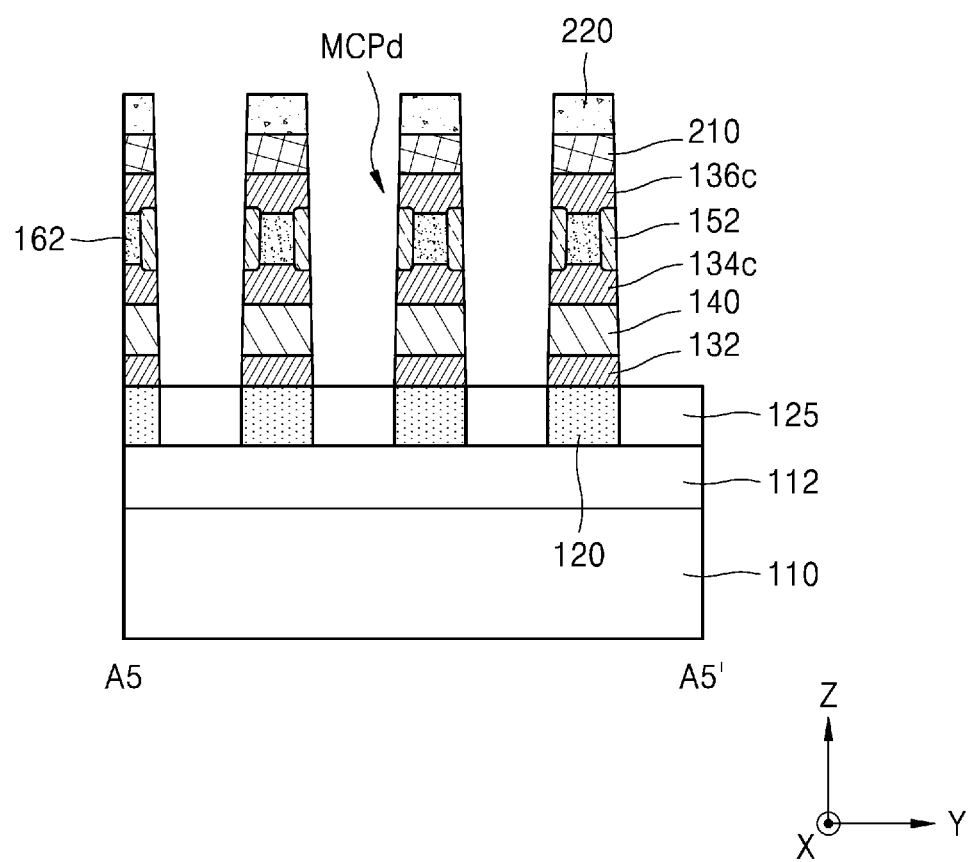

Referring to FIGS. 12D and 12E, by removing a portion of the variable resistance material layer 152P, the memory cells MCPd, each of which includes the lower electrode 132, the switch material pattern 140, the intermediate electrode 134c, the variable resistance memory layer 152, the buffer resistance layer 162, and the upper electrode 136c, may be formed. The variable resistance memory layer 152 may be formed by removing portions, other than portions of the variable resistance material layer 152P between the intermediate electrode 134c and the upper electrode 136c, that is, the portions filling the recesses 162R. In an implementation, portions of the variable resistance material layer 152P, which fill the recess 162R, may remain and become the variable resistance memory layer 152. The variable resistance memory layer 152 may have a ring-shaped horizontal cross-section surrounding the periphery of the buffer resistance layer 162. The upper surface of the variable resistance memory layer 152 may be at the higher vertical level than the upper surface of the buffer resistance layer 162, and the lower surface of the variable resistance memory layer 152 may be at the lower vertical level than the lower surface of the buffer resistance layer 162. That is, the vertical height of the variable resistance memory layer 152 may be greater than that of the buffer resistance layer 162.

Figure 12F:
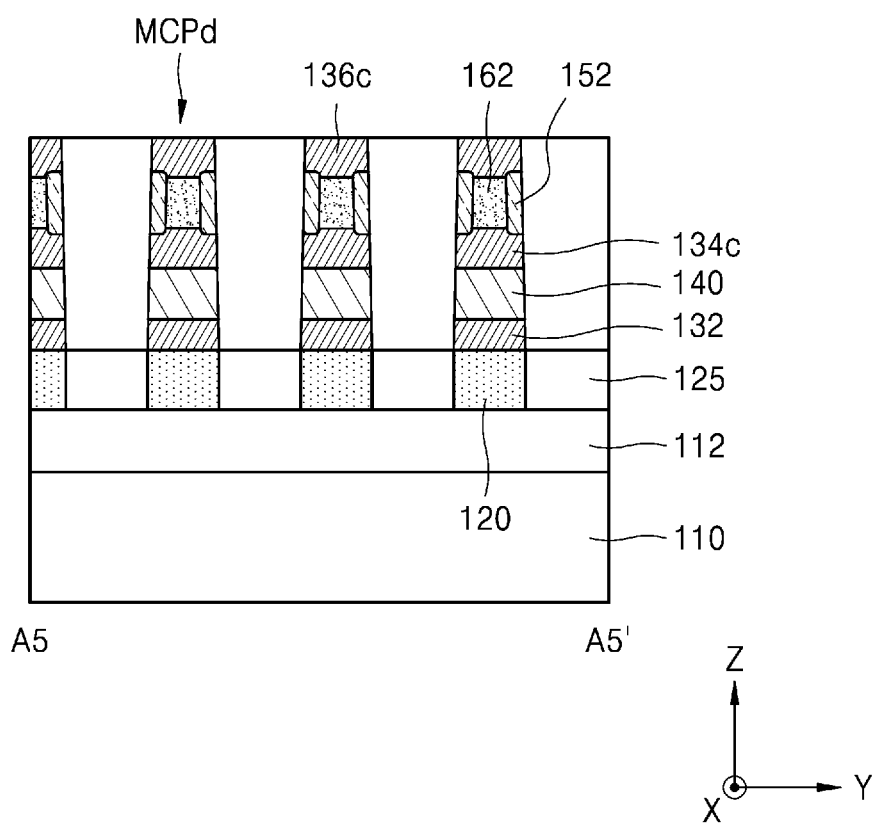

Referring to FIG. 12F, the buried insulating layer 170 filling the gaps between the memory cells MCPd may be formed. Then, as shown in FIG. 6A, the memory device 100d may be formed by forming, on the memory cells MCPd and the buried insulating layer 170, the second conductive lines 180 respectively connected to the upper electrodes 136c of the memory cells MCPd and the second insulating layers 185 filling the gaps between the second conductive lines 180.

FIGS. 13A to 13D are cross-sectional views sequentially showing processes to describe a manufacturing method of a memory device, according to example embodiments. In detail, FIGS. 13A to 13D are example cross-sectional views taken along a line A7-A7' of FIG. 8A. The same reference symbols as those in FIGS. 11A to 11H denote substantially the same elements in FIGS. 13A to 13D, and the descriptions provided with reference to FIGS. 11A to 11H may be omitted.

Figure 13A:
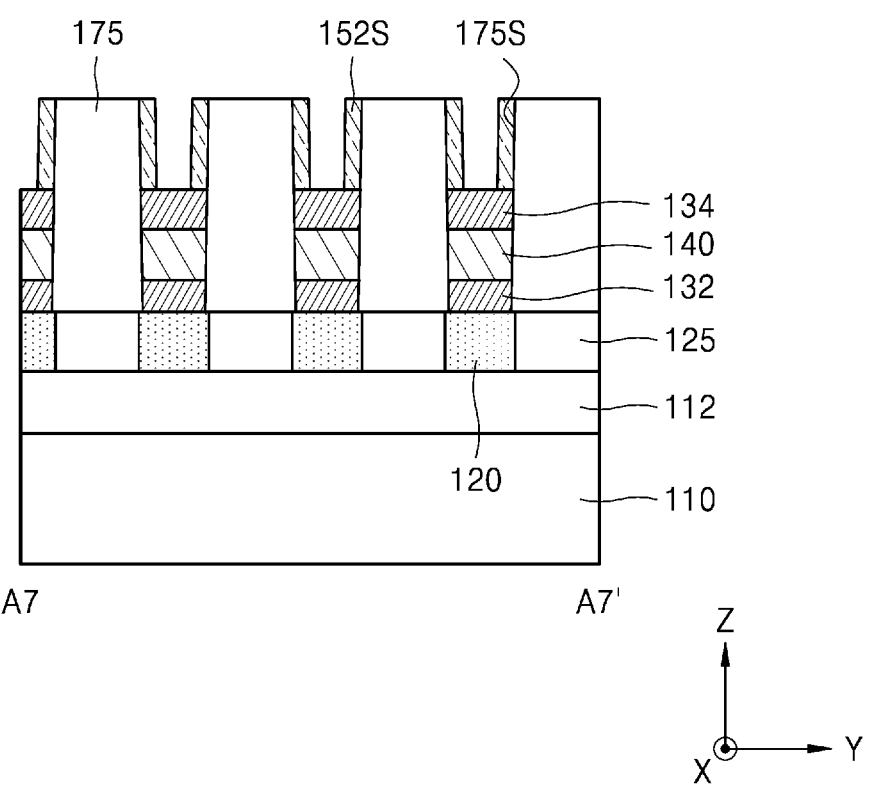
FIGS. 13A to 13D are cross-sectional views of stages in a manufacturing method of a memory device, according to example embodiments.

Referring to FIG. 13A, after the processes described with reference to FIGS. 11A to 11D are performed, variable resistance spacers 152S covering inner side walls of the first spaces 175S are formed. The variable resistance spacer 152S may be formed by forming the variable resistance material layer, which conformally covers the inner side walls and bottom surfaces of the first spaces 175S and the upper surface of the buried insulating layer 175, and then removing portions of the variable resistance material layer, which cover the bottom surfaces of the first spaces 175S and the upper surface of the buried insulating layer 175, through anisotropic etching.

Figure 13B:
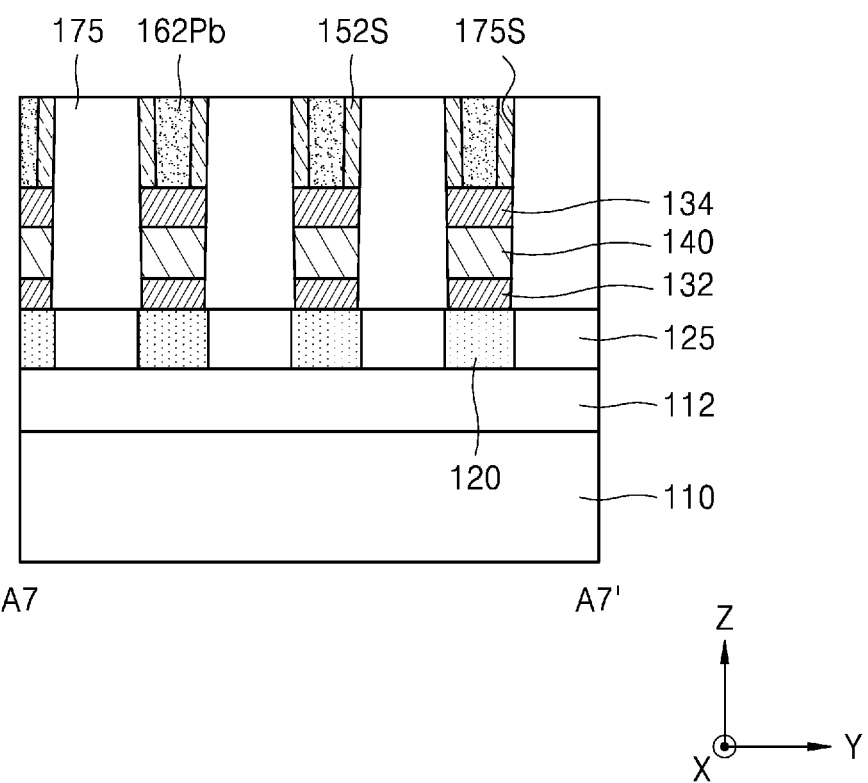
Figure 13C:
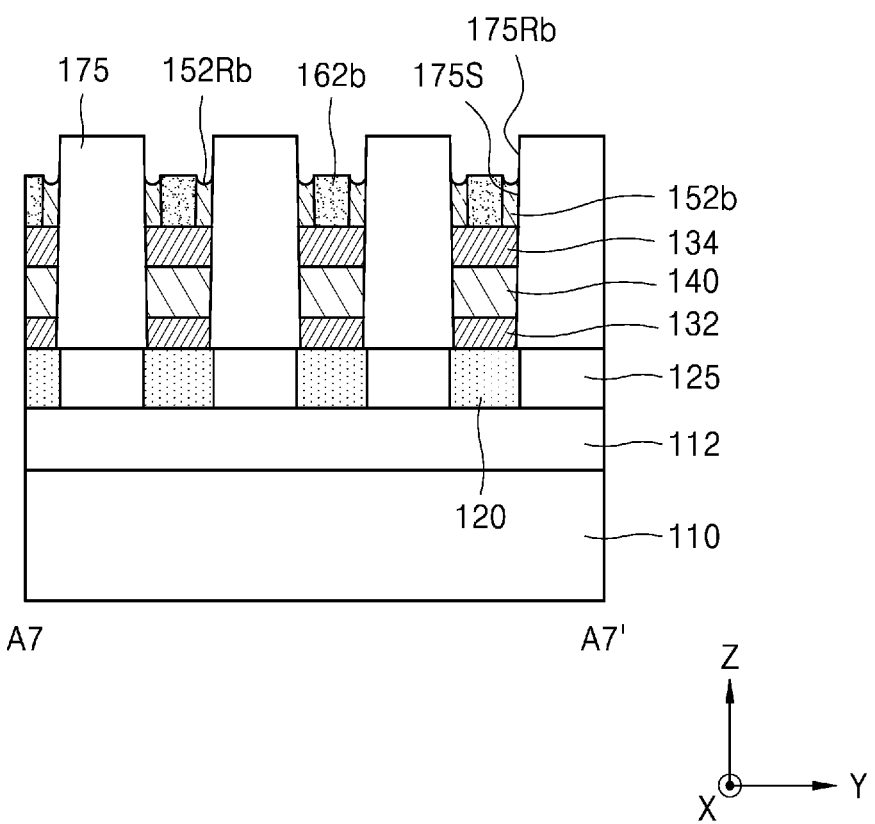

Referring to FIGS. 13B and 13C, after buffer resistance material patterns 162Pb filling the first spaces 175S are formed, the variable resistance memory layer 152b and the buffer resistance layer 162b may be formed by removing upper portions of the variable resistance spaces 152S and the buffer resistance material patterns 162Pb. In the variable resistance memory layer 152b and the buffer resistance layer 162b, second spaces 175Rb limited by the buried insulating layer 175 may be formed. The second spaces 175Rb may be upper portions of the first spaces 175S.

In a process for removing upper portions of the variable resistance spacer 152S and the buffer resistance material pattern 162Pb to form the variable resistance memory layer 152b and the buffer resistance layer 162b, more of the variable resistance spacer 152S may be removed than the buffer resistance material pattern 162Pb, and the concave recesses 152Rb may be formed in the upper surface of the variable resistance memory layer 152b. Bottom surfaces of the recesses 152Rb may be at lower vertical levels than the upper portions of the buffer resistance layer 162b.

In an implementation, as shown in FIG. 13B, instead of forming the buffer resistance material pattern 162Pb filling the first spaces 175S, the first spaces 175S may be filled, and the buffer resistance material layer covering the upper surface of the buried insulating layer 175 may be formed. Then, a portion of the buffer resistance material layer covering the upper surface of the buried insulating layer 175, other portions of the buffer resistance material layer filling the upper portions of the first spaces 175S, an upper portion of the variable resistance spacer 152S may be removed, and the variable resistance memory layer 152b and the buffer resistance layer 162b may be formed.

Figure 13D:
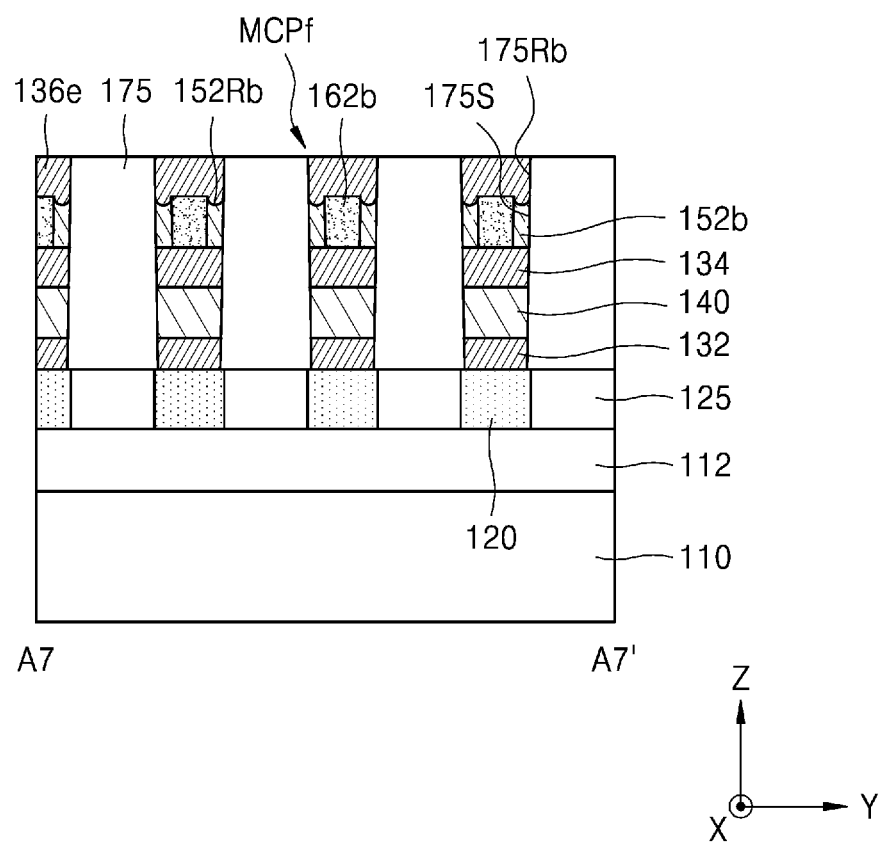

Referring to FIG. 13D, the upper electrodes 136e filling the second spaces 175Rb may be formed on the variable resistance memory layer 152b and the buffer resistance layer 162b, and the memory cells MCPf, each of which includes the lower electrode 132, the switch material pattern 140, the intermediate electrode 134, the variable resistance memory layer 152b, the buffer resistance layer 162b, and the upper electrode 136e, may be formed. The upper electrode 136e may have a protruding lower (e.g., outer or peripheral) surface to fill the recess 152Rb of the variable resistance memory layer 152b.

Then, as shown in FIG. 8A, the memory device 102b may be formed by forming, on the memory cells MCPf and the buried insulating layer 175, the second conductive lines 180 connected to the upper electrodes 136e of the memory cells MCPf and the second insulating layers 185 filling the gaps between the second conductive lines 180.

FIGS. 14A to 14D are cross-sectional views of memory devices according to example embodiments. The same reference symbols as those in FIGS. 1 to 13D denote substantially the same elements in FIGS. 14A to 13D, and the descriptions provided with reference to FIGS. 1 to 13D may be omitted.

Figure 14A:
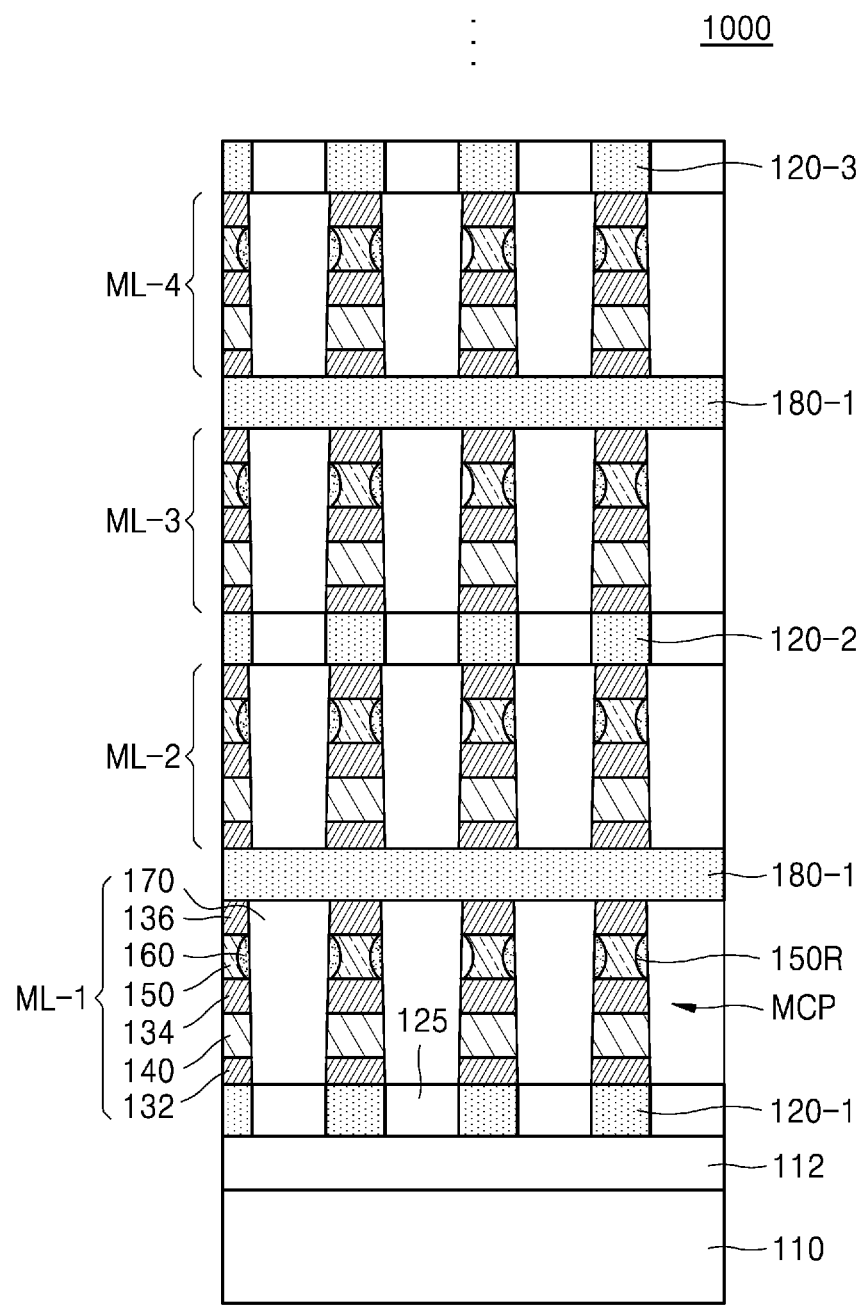
FIGS. 14A to 14D are cross-sectional views of memory devices according to example embodiments.

Referring to FIG. 14A, a memory device 1000 includes word lines 120-1, 120-2, and 120-3 and bit lines 180-1 and 180-2, and memory cell layers ML-1, ML-2, ML-3, and ML-4 which are alternately arranged in a vertical direction. The memory cell layers ML-1, ML-2, ML-3, and ML-4 respectively include memory cells MCP that are arranged at the same vertical level.

In an implementation, the word lines 120-1, 120-2, and 120-3 may include first word lines 120-1, second word lines 120-2, and third word lines 120-3, and the bit lines 180-1 and 180-2 may include first bit lines 180-1 and second bit lines 180-2. The first word lines 120-1 may be arranged at the same level, the second word lines 120-2 may be arranged at the same level, and the third word line 120-3 may be arranged at the same level. The first word lines 120-1, the second word lines 120-2, and the third word line 120-3 may be arranged at different vertical levels. As described, the first bit lines 180-1 may be at the same vertical level, and the second bit lines 180-2 may be at the same vertical level. The first bit lines 180-1 and the second bit lines 180-2 may be arranged at different vertical levels.

The first to third words lines 180-1 to 180-3 are substantially the same as the first conductive lines 120 described with reference to FIGS. 2A to 13D, respectively, and thus, detailed descriptions will be omitted. The first bit lines 180-1 and the second bit lines 180-2 are substantially the same as the second conductive lines 180 described with reference to FIGS. 2A to 13D, respectively, and thus, detailed descriptions will be omitted.

The memory cell layers ML-1, ML-2, ML-3, and ML-4 may be between the word lines 120-1 to 120-3 and the bit lines 180-1 and 180-2 that are at different vertical levels. In an implementation, the memory cell layers ML-1, ML-2, ML-3, and ML-4 may include first memory cell layers ML-1, second memory cell layers ML-2, third memory cell layers ML-3, and fourth memory cell layers ML-4 that are at different vertical levels.

The memory device 1000 may be a memory device having a three-dimensional (3D) cross-point structure and including the memory cell layers ML-1, ML-2, ML-3, and ML-4. In an implementation, as illustrated in FIG. 14A, the memory cell layers ML-1, ML-2, ML-3, and ML-4 may be at four different vertical levels. In an implementation, the memory cell layers ML-1, ML-2, ML-3, and ML-4 may be at two, three, or five or more different vertical levels.

Figure 14B:
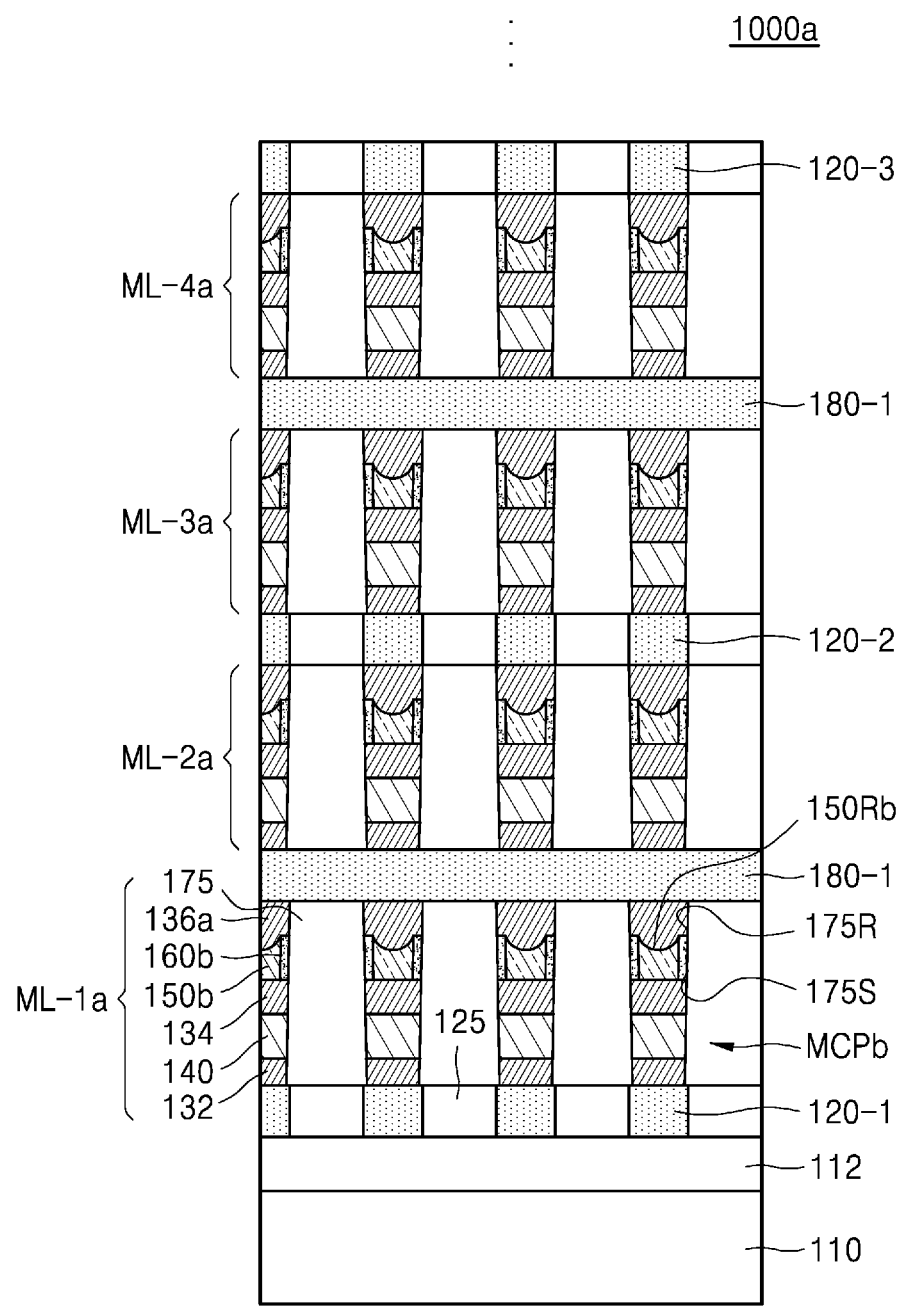

Referring to FIG. 14B, a memory device 1000*a* may include the word lines 120-1, 120-2, and 120-3, the bit lines 180-1 and 180-2, and memory cell layers ML-la, ML-2*a*, ML-3*a*, and ML-4*a* that are alternately arranged in the vertical direction. The memory cell layers ML-la, ML-2*a*, ML-3*a*, and ML-4*a* may respectively include the memory cells MCPb that are at the same vertical level. The memory device 1000*a* may be a memory device having a 3D cross-point structure and including the memory cell layers ML-la, ML-2*a*, ML-3*a*, and ML-4*a*.

Figure 14C:
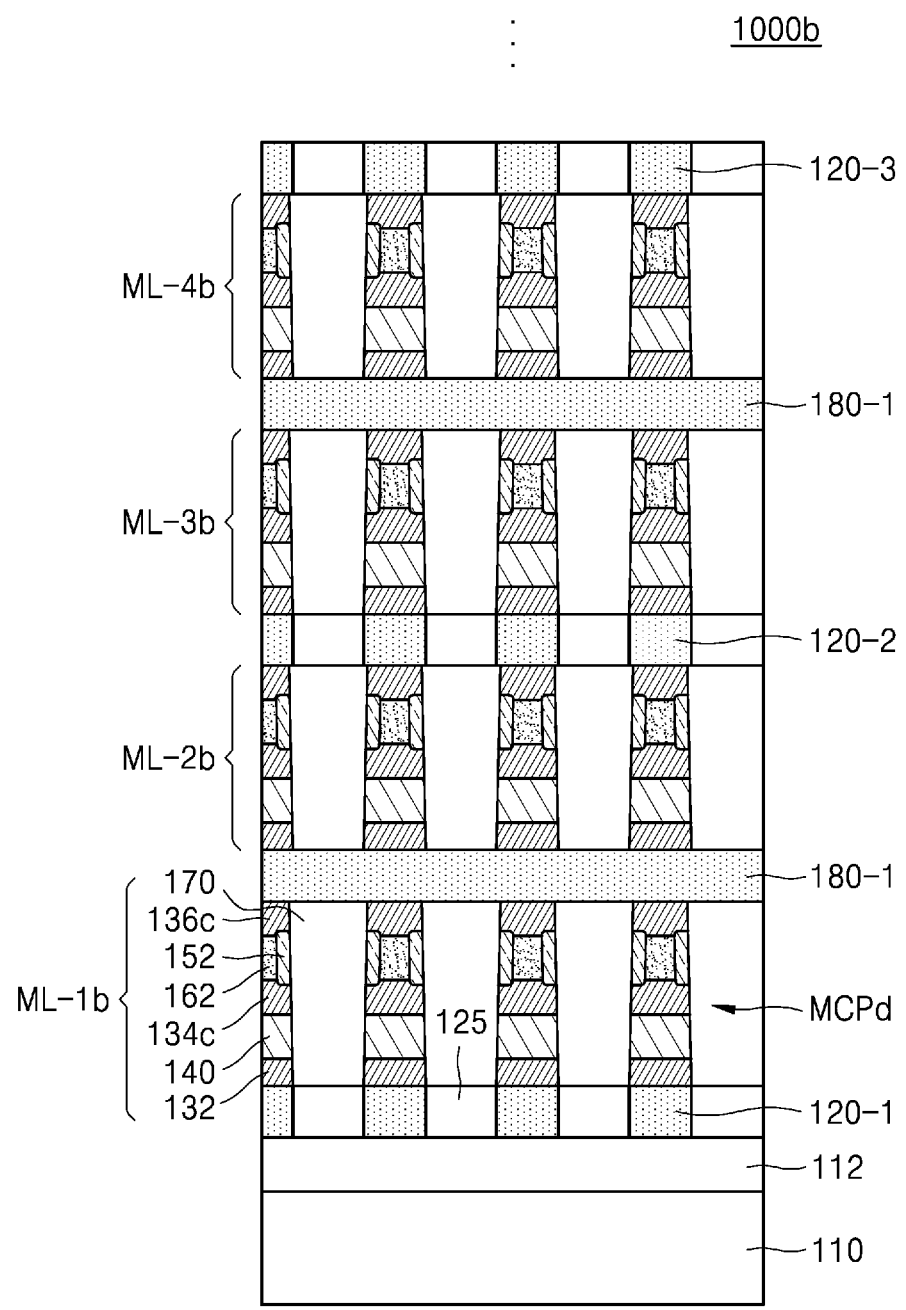

Referring to FIG. 14C, a memory device 1000*b* may include the word lines 120-1, 120-2, and 120-3, the bit lines 180-1 and 180-2, and memory cell layers ML-1*b*, ML-2*b*, ML-3*b*, and ML-4*b* that are alternately arranged in the vertical direction. The memory cell layers ML-1*b*, ML-2*b*, ML-3*b*, and ML-4*b* may respectively include the memory cells MCPd that are at the same vertical level. The memory device 1000*b* may be a memory device having a 3D cross-point structure and including the memory cell layers ML-1*b*, ML-2*b*, ML-3*b*, and ML-4*b*.

Figure 14D:
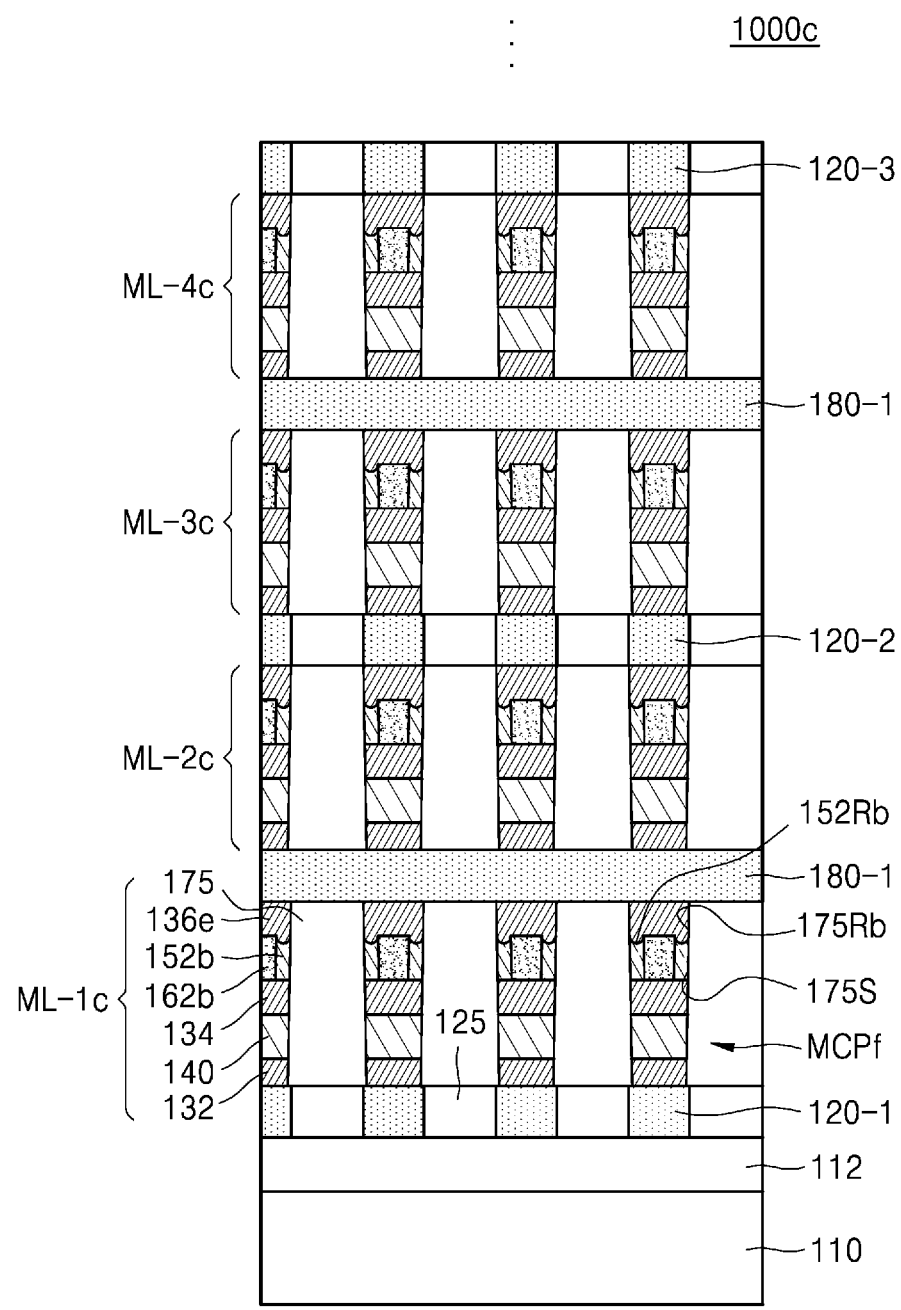

Referring to FIG. 14D, a memory device 1000*c* may include the word lines 120-1, 120-2, and 120-3, the bit lines 180-1 and 180-2, and memory cell layers ML-1*c*, ML-2*c*, ML-3*c*, and ML-4*c* that are alternately arranged in the vertical direction. The memory cell layers ML-1*c*, ML-2*c*, ML-3*c*, and ML-4*c* may respectively include the memory cells MCPf that are at the same vertical level. The memory device 1000*c* may be a memory device having a 3D cross-point structure and including the memory cell layers ML-1*c*, ML-2*c*, ML-3*c*, and ML-4*c*.

One or more embodiments may provide a memory device having a cross-point array structure.

One or more embodiments may provide a memory device having a cross-point structure and including a memory cell that has improved endurance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
a first conductive line on a substrate and extending in a first horizontal direction;
a second conductive line on the first conductive line and extending in a second horizontal direction that is perpendicular to the first horizontal direction; and
a memory cell between the first conductive line and the second conductive line, the memory cell:
including a variable resistance memory layer, a buffer resistance layer, and a switch material pattern,
extending in a vertical direction that is perpendicular to the first horizontal direction and the second horizontal direction, and
having a tapered shape with a decreasing horizontal width along the vertical direction,
wherein:
at least a part of the variable resistance memory layer and at least a part of the buffer resistance layer of the memory cell are at a same vertical level,
the variable resistance memory layer includes a recess in side walls thereof, and
the buffer resistance layer fills the recess.

2. The memory device as claimed in claim 1, wherein:
the variable resistance memory layer has a circular horizontal cross-section, and
the buffer resistance layer has a ring-shaped horizontal cross-section surrounding a periphery of the variable resistance memory layer.

3. The memory device as claimed in claim 1, wherein:
the variable resistance memory layer has a square horizontal cross-section, and the buffer resistance layer extends along each of lateral sides of the variable resistance memory layer.

4. The memory device as claimed in claim 1, wherein the recess of the variable resistance memory layer surrounds the variable resistance memory layer along the side walls of the variable resistance memory layer.

5. The memory device as claimed in claim 1, wherein the recess of the variable resistance memory layer extends in the first horizontal direction along each of the side walls of the variable resistance memory layer.

6. The memory device as claimed in claim 1, wherein:
the memory cell further includes an upper electrode between the second conductive line and the variable resistance memory layer and buffer resistance layer.

7. The memory device as claimed in claim 1, wherein:
the buffer resistance layer has a circular horizontal cross-section, and
the variable resistance memory layer has a ring-shaped horizontal cross-section surrounding a periphery of the buffer resistance layer.

8. The memory device as claimed in claim 1, wherein:
the buffer resistance layer has a square horizontal cross-section, and
the variable resistance memory layers have a bar-shaped horizontal cross-sections extending along both lateral sides of the buffer resistance layer.

9. The memory device as claimed in claim 1, wherein the memory cell has a tapered shape extending from a lower portion to an upper portion in the vertical direction and having a decreasing horizontal width.

10. A memory device, comprising:
a plurality of first conductive lines on a substrate and extending in a first horizontal direction;
a plurality of second conductive lines on the plurality of first conductive lines and extending in a second horizontal direction that is perpendicular to the first horizontal direction; and
a plurality of memory cells respectively between the plurality of first conductive lines and the plurality of second conductive lines, each memory cell of the plurality of memory cells including: a lower electrode, an intermediate electrode, an upper electrode, a variable resistance memory layer and a buffer resistance layer, which are connected between the intermediate electrode and the upper electrode in parallel, and a switch material pattern between the lower electrode and the intermediate electrode,
wherein:
the variable resistance memory layer includes a recess that is concave,
the recess in the variable resistance memory layer is in side walls thereof, and
the buffer resistance layer has an inner side wall that is convex to fill the recess.

11. The memory device as claimed in claim 10, wherein the buffer resistance layer surrounds a periphery of the variable resistance memory layer.

12. The memory device as claimed in claim 10, wherein, in each of the plurality of memory cells, buffer resistance layers extend along both lateral sides of the variable resistance memory layer.

13. The memory device as claimed in claim 10, wherein the variable resistance memory layer surrounds a periphery of the buffer resistance layer.

14. The memory device as claimed in claim 10, wherein, in each of the plurality of memory cells, variable resistance memory layers extend along both lateral sides of the buffer resistance layer.

15. A memory device, comprising:
a plurality of first conductive lines on a substrate and extending in a first horizontal direction;
a plurality of second conductive lines on the plurality of first conductive lines and extending in a second horizontal direction that is perpendicular to the first horizontal direction; and
a plurality of memory cells respectively between the plurality of first conductive lines and the plurality of second conductive lines, each memory cell of the plurality of memory cells including: a lower electrode, an intermediate electrode, an upper electrode, a variable resistance memory layer and a buffer resistance layer, which are connected between the intermediate electrode and the upper electrode in parallel, and a switch material pattern between the lower electrode and the intermediate electrode,
wherein:
the variable resistance memory layer has a circular horizontal cross-section, and
the buffer resistance layer has a ring-shaped horizontal cross-section surrounding a periphery of the variable resistance memory layer, the buffer resistance layer including a material having a resistivity that is less than a resistivity of the variable resistance memory layer in a high-resistance state and greater than a resistivity of the variable resistance memory layer in a low-resistance state.

16. The memory device as claimed in claim 15, wherein the variable resistance memory layer includes a recess that is concave and surrounds the variable resistance memory layer along side walls of the variable resistance memory layer.

17. The memory device as claimed in claim 16, wherein the buffer resistance layer includes an inner side wall that is convex to fill the recess.

18. The memory device as claimed in claim 15, wherein each of the plurality of memory cells has a tapered shape with a decreasing horizontal width along a vertical direction that is perpendicular to the first horizontal direction and the second horizontal direction.

* * * * *